United States Patent
Zimmerman et al.

(10) Patent No.: US 7,808,407 B2
(45) Date of Patent: Oct. 5, 2010

(54) SUB-CHANNEL DISTORTION MITIGATION IN PARALLEL DIGITAL SYSTEMS

(75) Inventors: George A. Zimmerman, Rolling Hills Estates, CA (US); William W. Jones, Aliso Viejo, CA (US)

(73) Assignee: Solarflare Communications, Inc., Irvine, CA (US)

( * ) Notice: Subject to any disclaimer, the term of this patent is extended or adjusted under 35 U.S.C. 154(b) by 0 days.

(21) Appl. No.: 12/157,452

(22) Filed: Jun. 9, 2008

(65) Prior Publication Data

US 2009/0021406 A1    Jan. 22, 2009

Related U.S. Application Data

(60) Provisional application No. 60/934,738, filed on Jun. 15, 2007.

(51) Int. Cl.
*H03M 1/06* (2006.01)
(52) U.S. Cl. .................................. 341/118; 341/155
(58) Field of Classification Search .......... 341/118, 341/115
See application file for complete search history.

(56) References Cited

U.S. PATENT DOCUMENTS

| | | | |
|---|---|---|---|
| 4,359,778 A | 11/1982 | Lee | |
| 4,583,235 A | 4/1986 | Dömer et al. | |
| 4,956,838 A | 9/1990 | Gilloire et al. | |
| 5,222,084 A | 6/1993 | Takahashi | |
| 5,239,299 A * | 8/1993 | Apple et al. ................. | 341/118 |
| 5,294,926 A * | 3/1994 | Corcoran ..................... | 341/120 |
| 5,305,307 A | 4/1994 | Chu | |
| 5,315,585 A | 5/1994 | Lizuka et al. | |
| 5,633,863 A | 5/1997 | Gysel et al. | |
| 5,646,958 A | 7/1997 | Tsujimoto | |
| 5,825,753 A | 10/1998 | Betts et al. | |

(Continued)

FOREIGN PATENT DOCUMENTS

EP   0 250 048   12/1987

(Continued)

OTHER PUBLICATIONS

M. Tomlinson, "New automatic equalizer employing modulo arithmetic," Electronic Letters, vol. 7, pp. 138-139, 1971.

(Continued)

*Primary Examiner*—Khai M Nguyen
(74) *Attorney, Agent, or Firm*—Weide & Miller, Ltd.

(57) ABSTRACT

A method and apparatus for compensating for gain offset, bias offset, and skew in a parallel processing environment is disclosed. The method and apparatus may be configured to compensate for mismatches between the sub-channel signals in a parallel ADC. This allows for accurate combination of the signals on the sub-channels. The method and apparatus may be utilized in a high speed data communication system having two or more channels, each of which are interleaved into two or more sub-channels. In one embodiment a DC loop processes signals on two or more sub-channels to account for and remove unwanted bias offset. In one embodiment a sub-channel gain mismatch compensation system (SCGMC) processes signals on two or more sub-channels to account for and remove unwanted gain offset. In one embodiment a skew compensation system, such as a parallel interpolator, processes signals on two or more sub-channels to remove unwanted skew across sub-channels.

29 Claims, 13 Drawing Sheets

U.S. PATENT DOCUMENTS

| | | | |
|---|---|---|---|
| 5,856,970 | A | 1/1999 | Gee et al. |
| 5,896,452 | A | 4/1999 | Yip et al. |
| 6,028,929 | A | 2/2000 | Laberteaux |
| 6,088,827 | A | 7/2000 | Rao |
| 6,147,979 | A | 11/2000 | Michel et al. |
| 6,160,790 | A | 12/2000 | Bremer |
| 6,178,162 | B1 | 1/2001 | Dal Farra et al. |
| 6,201,831 | B1 | 3/2001 | Agazzi et al. |
| 6,226,332 | B1 | 5/2001 | Agazzi et al. |
| 6,249,544 | B1 | 6/2001 | Azzazi et al. |
| 6,252,904 | B1 | 6/2001 | Agazzi et al. |
| 6,253,345 | B1 | 6/2001 | Agazzi et al. |
| 6,272,173 | B1 | 8/2001 | Hatamian |
| 6,285,653 | B1 | 9/2001 | Koeman et al. |
| 6,297,647 | B2 | 10/2001 | Kirk et al. |
| 6,304,598 | B1 | 10/2001 | Agazzi et al. |
| 6,324,170 | B1 | 11/2001 | McClennon et al. |
| 6,351,531 | B1 | 2/2002 | Tahernezhaadi et al. |
| 6,356,555 | B1 | 3/2002 | Rakib et al. |
| 6,392,575 | B1 * | 5/2002 | Eklund ................. 341/141 |
| 6,433,558 | B1 | 8/2002 | Sciacero et al. |
| 6,463,041 | B1 | 10/2002 | Agazzi |
| 6,473,013 | B1 * | 10/2002 | Velazquez et al. ........... 341/120 |
| 6,480,532 | B1 | 11/2002 | Vareljian |
| 6,493,448 | B1 | 12/2002 | Mann et al. |
| 6,522,282 | B1 * | 2/2003 | Elbornsson ................. 341/155 |
| 6,584,160 | B1 | 6/2003 | Amrany et al. |
| 6,618,480 | B1 | 9/2003 | Polley et al. |
| 6,665,402 | B1 | 12/2003 | Yue et al. |
| 6,687,235 | B1 | 2/2004 | Chu |
| 6,898,281 | B1 | 5/2005 | Larsson et al. |
| 7,084,793 | B2 * | 8/2006 | Elbornsson ................. 341/118 |
| 7,138,933 | B2 * | 11/2006 | Nairn ......................... 341/141 |
| 7,336,729 | B2 * | 2/2008 | Agazzi ....................... 375/316 |
| 7,482,956 | B2 * | 1/2009 | Huang et al. ................ 341/120 |
| 2001/0036160 | A1 | 11/2001 | Curran et al. |
| 2002/0067824 | A1 | 6/2002 | Wang |
| 2002/0106016 | A1 | 8/2002 | Egelmeers et al. |
| 2002/0191552 | A1 | 12/2002 | Watkinson |
| 2003/0063663 | A1 | 4/2003 | Bryant |
| 2003/0067888 | A1 | 4/2003 | Bina et al. |
| 2003/0099208 | A1 | 5/2003 | Graziano et al. |
| 2004/0001427 | A1 | 1/2004 | Belotserkovsky et al. |
| 2007/0237270 | A1 | 10/2007 | Mezer et al. |

FOREIGN PATENT DOCUMENTS

| | | |
|---|---|---|
| JP | 2003-250193 | 9/2003 |
| JP | 2009-116472 | 5/2009 |
| KR | 10-2007-0018663 | 2/2007 |

OTHER PUBLICATIONS

H. Harashima and H. Miyakawa, "Matched-transmission technique for channels with intersymbol interference," IEEE Transactions on Communications, vol. COM-20, No. 4, pp. 774-780, Aug. 1972.

P. Kabal and S. Pasupahty, "Partial-response signaling" IEEE Transactions on Communications, vol. COM-23, No. 9, pp. 921-934, Sep. 1975.

R. F. H. Fischer, W. H. Gerstacker, and J. B. Huber, "Dynamics limited precoding, shaping, and blind equalization for fast digital transmission over twisted pair lines," IEEE Journal on Selected Areas in Communications, vol. 13, No. 9, pp. 1622-1633 Dec. 1995.

R. F. H. Fischer and J. B. Huber, "Comparison of precoding schemes for digital subscriber lines," IEEE Transactions on Communications, vol. 45, No. 3, pp. 334-343, Mar. 1997.

Oscar Agazzi, et al., "10Gb/s PMD Using PAM-5 Trellis Coded Modulation", Broadcom, IEEE 802.3, Albuquerque, New Mexico, Mar. 6-10, 2000, 38 pages.

Jamie E. Kardontchik, "4D Encoding in Level-One's Proposal for 1000BASE-T", Advanced Micro Devices, Aug. 21, 1997-Rev. B, pp. 1-24.

Erich F. Harastch, et al., "A 1-Gb/s Joint Equalizer and Trellis Decoder for 1000BASE-T Gigabit Ethernet", IEEE Journal of Solid-State Circuits, vol. 36, No. 3, Mar. 2001, pp. 374-384.

Mehdi Hatamian, et al., "Design Considerations for Gigabit Ethernet 1000Base-T Twisted Pair Transceivers", IEEE 1998 Custom Integrated Circuits Conference, Santa Clara, CA, May 1998, pp. 335-342.

Gottfried Unger Boeck, "Trellis-Coded Modulation with Redundant Signal Sets", IEEE Communications Magazine, Feb. 1987, vol. 25, No. 2, pp. 5-21.

"Gigabit Ethernet Over Category 5", Copyright 2000-2001 Agilent Technologies, 12 pages.

M.P. Sellers, et al., "Stabilized Precoder for Indoor Radio Communications", IEEE Communications Letters, vol. 4, No. 10, Oct. 2000, pp. 315-317.

"Wirescope 350-Understanding Elfext", © Agilent Technologies, 2 pages.

David Crawford, "Adaptive Filters", © David Crawford 1996, pp. 1-5.

David A. Johns, et al., "Integrated Circuits for Data Transmission Over Twisted-Pair Channels", IEEE Journal of Solid-State Circuits, vol. 32 No. 3, Mar. 1997, pp. 398-406.

Prof. David Johns, University of Toronto, "Equalization", © D.A. Johns 1997, 29 pages.

David Smalley, "Equalization Concepts: A Tutorial", Atlanta Regional Technology Center, Texas Instruments, pp. 1-29, Oct. 1994.

Shao-Po Wu, et al., "FIR Filter Design via Spectral Factorization and Convex Optimization", to appear as Chapter 1 of Applied Computational Control, Signal and Communications, Biswa Datta Editor, Birkhauser, 1977, pp. 1-33.

Richard D. Wesel, et al., "Achievable Rates for Tomlinson-Harashima Precoding", IEEE Transactions on Information Theory, vol. 44, No. 2, Mar. 1998, pp. 824-831.

Wolfgang H. Gerstacker, et al., "Blind Equalization Techniques for xDSL Using Channel Coding and Precoding", submitted to AEÜ Int. J. Electr. Commun., pp. 1-4, May 1999.

Chip Fleming, "A Tutorial on Convolutional Coding with Viterbi Decoding", © 1999-2002, Spectrum Applications, pp. 1-6.

"ELFEXT—Introduction", Fluke Networks™, © 2000, pp. 1-2.

"Transformer Polarity", Copyright 2002 Kilowatt Classroom, 11C, 1 pages (Date Unknown).

"Application Note-Design of H.F. Wideband Power Transformers; Part 11-EC07213", Philips Semiconductors, pp. 1-10, Mar. 23, 1998.

"Technical Information-Use of Ferrites in Broadband Transformers", Fair-Rite Products, Corp., 14th Edition, pp. 170-173 (Date Unknown).

Huiting Chen, et al. "Current Mirror Circuit with Accurate Mirror Gain for Low β Transistors", supported in part by Dallas Semiconductor Corp., 4 pages, (Date Unknown).

A. Hekersdorf, et al., "A Scalable SDH/SONET Framer Architecture for DATACOME and TELCO Applications", IBM Research, Zurich Research Laboratory, Switzerland, 8 pages (Date Unknown).

Christopher T. DiMinico of Cable Design Technologies (CDT) Corporation, Massachusetts and Paul Kish of NORDX/CDT, Montreal Canada, "Development of Equal Level Far-End Crosstalk (ELFEXT) and Return Loss Specifications for Gigabit Ethernet Operation on Category 5 Copper Cabling", 10 pages (Date Unknown).

Pedro Silva, et al., "Precoder Circuit for Channels with Multipath Dispersion", Telecommunications Institute, Department of Electronics and Telecommunications Engineering, The University of Aveiro-University Campus, Portugal, 4 pages (Date Unknown).

"Tutorial: Adaptive Filter, Acoustic Echo Canceller, and its Low Power Implementation", © of Freehand Communications AB, 6 pages (Date Unknown).

Shao-Po Wu, et al., "FIR Filter Design via Semidefinite Programming and Spectral Factorization", Information Systems Laboratory, Stanford University, CA, 6 pages (Date Unknown).

J. Ježek, Institute of Information Theory and Automation, Prague, Czech Republic, et al., "New Algorithm for Spectral Factorization and its Practical Application", pp. 1-6 (Date Unknown).

"ADSL Tutorial", http://www.dslforum.org/aboutdsl/adsl_tutorial.html, pp. 1-3 (Date Unknown).

"Introduction to DSP", http://www.bores.com/course/intro/filters/4_fir.htm, pp. 1-2 (Date Unknown).

"QAM_VR-QAM Demodulator with Variable Rate", DesignObjects™ by sci-worx, pp. 1-2 (Date Unknown).

"Description of Algorithms" (Part 1), http://pw1.netcom.com/~chip.f/viterbi/algrthms.html. pp. 1-7 (Date Unknown).

"Fast Fourier Transform", http://cas.ensmp.fr/~chaplais/Wavetour_presentation/transformees/Fourier/FFTUS.html, pp. 1-2 (Date Unknown).

"Continuous Time Aperiodic Signals: The Fourier Transform", http://ece.uesd.edu/~cruz/ece.101/notes/node32.html, pp. 1-2, (Date Unknown).

"Convolution", http://www.wam.umd.edu/~toh/spectrum/convolution.html. pp. 1-2 (Date Unknow).

"Convolution by DFT", http://www.gresilog.com/english/excommen/doc/convid.htom, pp. 1-3 (Date Unknown).

"Electric Machinery: Chap. 2 Transformer- Dot Convention to Denote the Polarity of a Transformer", http://peinclab.cn.neiu.edu.tw/W3elemac/W3slide/ch2.xformer/sld009.htm (Date Unknown).

"Iowegian's dspGuru FIR FAQ Part 2: Properties", © 1999-2000 Iowegian International Corp., pp. 1-4.

"28.5 Protocol Implementation Conformance Statement (PICS) Proforma for Clause 28, Physical Layer Link Signaling for 10Mb/s, 100 Mb/s and 1000Mb/s Auto-Negotiation on Twisted Pair", *IEEE STD*. 802.3, 1998 Edition, pp. 6-14 and 18-44.

"Producing a Counter EMF", http://www.tpub.com/neets/book2/5e.htm (Date Unknown).

\* cited by examiner

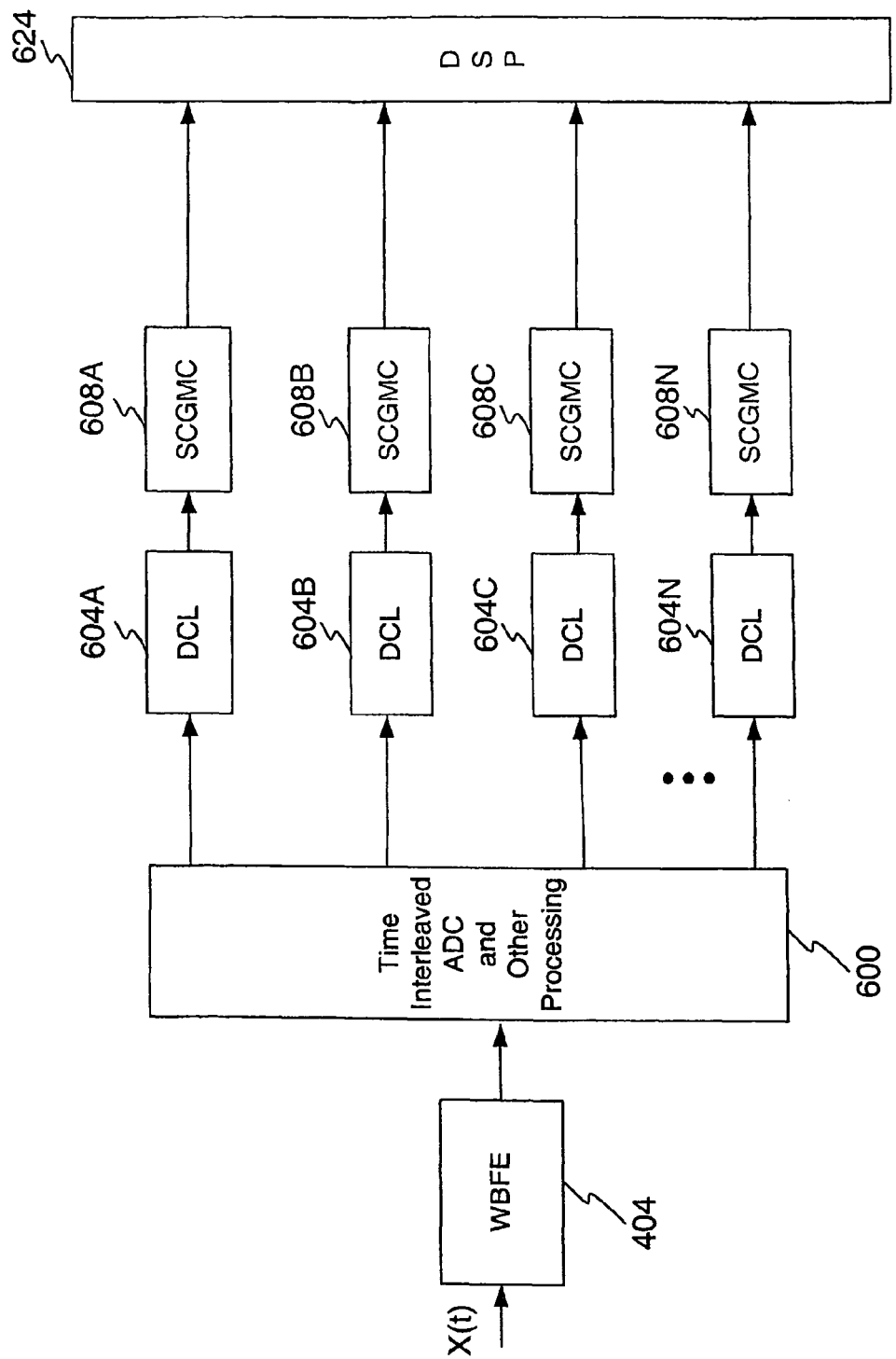

SUB-CHANNEL DISTORTION MITIGATION IN PARALLEL DIGITAL SYSTEMS

PRIORITY CLAIM

This application claims priority to Provisional Patent Application No. 60/934,738 entitled Sub-Channel Distortion Mitigation in Parallel Digital Systems which was filed on Jun. 15, 2007.

FIELD OF THE INVENTION

The invention relates to data communication and in particular a method and apparatus for mitigating sub-channel distortion in a communication system.

RELATED ART

There is a continuing demand for electronic systems to operate at higher rates or process greater amounts of data. This often necessitates that data within the electronic system or between remote electronic systems be exchanged or processed at rates greater than that performed by prior systems. As can be appreciated, it may not be possible to achieve such data processing or exchange at the desired rates utilizing methods and apparatus of the prior art. Hence, there exists a need in the art for an ability to increase processing speeds and data exchange rates.

It is common in the area of data processing and exchange to convert analog signals to a digital format for processing, storage, transmission, or the like. As is understood by one of ordinary skill in the art, the analog to digital signal conversion (A/D conversion) is a common procedure and hence, the numerous applications utilizing an A/D conversion are known by those of skill in the art.

As data rate processing and exchange rates increase, so too does the need to perform the analog to digital conversion at higher rates. One proposed solution has been to simply increase the rate at which the A/D converters (ADC) operate to thereby accommodate the increased operating rate. This proposed solution, however, suffers from the drawback that prior art ADCs are limited in speed, and performance suffers as the processing rate increases. Thus, prior art ADCs are simply unable to perform at higher rates while maintaining desired performance levels. Among other reasons, the track and hold operation performed by the ADC may not occur rapidly enough to match the received data rate for a particular performance level.

To address this need in the art, it has been proposed to distribute the processing such that a high data rate signal is split into multiple signals, each of which operate at a data rate that is lower than the high data rate signal. Processing may then occur on these distributed signals. This may be referred to as distributed processing. Although beneficial to reduce the processing rate for each signal, the separation of a high data rate signal into multiple lower data rate signals is not without drawbacks.

One such drawback is that as the signal is separated, such as onto sub-channel, the processing associated with the different paths for the sub-channels may differ slightly from one sub-channel to the next. As a result, the signals on each sub-channel may experience processing variation and hence, certain aspects of the signal may vary across the sub-channels. In particular, each of the sub-channels may vary in the level of gain, DC offset, or skew. The processing variations may occur as a result of slight differences during the manufacturing process, or because of slight differences between the clock signals provided to each sub-channel processing path.

Disclosed herein is a method and apparatus to mitigate one or more DC offset, skew and gain offset between signals in a communication device that utilizes distributed processing.

SUMMARY OF THE INVENTION

A system for processing an analog signal to convert the analog signal to a digital signal is disclosed herein. In one embodiment, the system comprises a time-interleaving analog to digital conversion system comprising an input configured to receive an analog signal, two or more analog to digital converters, two or more sub-channel outputs configured to carry the two or more digital signals, a DC offset compensation system, and a multiplexer configured to receive and combine at least one compensated digital signal and at least one digital signal or two or more compensated digital signals to create a digital signal representative of the analog signal.

The two or more analog to digital converters may be configured to convert at least a portion of the analog signal to two or more digital signals. The DC offset compensation system may be associated with at least one sub-channel output, and configured to receive a digital signal and remove bias offset from the received digital signal to create at least one compensated digital signal. It is noted that, in one or more embodiments, the bias offset may comprise the difference in voltage values for a constant input between the digital signals output from the time-interleaving analog to the digital conversion system.

The DC offset compensation system may have various configurations. For example, the DC offset compensation system may comprise a DC loop. In addition, the DC offset compensation system may comprise a DC loop associated with each sub-channel and configured to perform DC offset removal on each digital signal from the time-interleaving analog to digital conversion system. Further, the DC offset compensation system may comprise a feedback filter configured to subtract the DC offset from digital signal.

In another embodiment of the invention, a parallel analog to digital converter system configured to perform analog signal to digital signal conversion of an analog signal is disclosed. This system may comprise an input configured to receive an analog signal, two or more parallel analog to digital converters configured to process the analog signal to thereby generate and output two or more digital signals on two or more sub-channels, and at least one DC loop configured to process at least one of the two or more digital signals to remove unwanted offset from at least one of the two or more digital signals. In this embodiment, each digital signal outputted by the two or more parallel analog to digital converters represents at least a portion of the analog signal.

It is contemplated that a DC loop may be associated with each sub-channel in some embodiments. In addition, a multiplexer may be provided in some embodiments to combine the output from each DC loop to create a composite digital signal representing the analog signal. The multiplexer may be configured to accurately combine the digital signals due to the removal of unwanted bias offset by the two or more DC loops. It is noted that the DC loop itself may comprise an accumulator configured to generate a DC offset value, and a subtractor configured to remove the DC offset value from at least one of the one or more digital signals. A multiplier configured to receive a control value selected to control the rate of change of the accumulator may be provided in one or more embodiments.

A method for removing inconsistencies in two or more digital signals from an analog to digital converter structure to enable accurate re-assembly of the two or more digital signals is provided according to the invention. It is contemplated that these inconsistencies may comprise DC offsets resulting from differences between analog to digital converters within the analog to digital converter structure.

In one embodiment, the method comprises receiving two or more digital signals on two or more sub-channels received from the analog to digital converter structure, providing the two or more digital signals to an offset compensation system, and processing the two or more digital signals to remove unwanted DC offset from each digital signal to thereby establish each digital signal at a generally similar DC offset level. It is noted that the two or more digital signals on the two or more sub-channels may be recombined into a single digital signal in some embodiments.

Each digital signal on the two or more sub-channels received from the analog to digital converter structure may be associated with a sub-channel. In addition, the offset compensation system may comprise a DC offset compensation module associated with each channel in some embodiments.

In one embodiment, the step of processing the two or more digital signals may comprise multiplying a digital signal by a control value to obtain a scaled digital signal, processing the scaled digital signal to generate an offset value representative of the DC offset generated by the analog to digital converter associated with the sub-channel, and subtracting the offset value from the digital signal to create a digital signal without DC offset. The value of the digital signal may be scaled prior to DC offset compensation to accommodate a fixed point processing environment if desired.

A method for converting a high frequency analog signal to a digital signal is also provided herein. The method may occur within a 10 gigabit communication system operating over CAT 5 cable if desired. In one embodiment this method comprises providing the analog signal to one or more analog to digital converters, converting the analog signal to two or more digital signals, receiving the two or more digital signals from the one or more analog to digital converters, processing at least one of the digital signals to establish the offset of the two or more digital signals at a generally similar offset level, and combining the two or more digital signal into a combined digital signal. Such combining may accurately occur due to the generally similar offset level of the two or more digital signal. The two or more digital signals received from the one or more analog to digital converters may be associated with two or more sub-channel according to this method. In addition, the processing of at least one of the digital signals may comprise subtracting a DC offset value, created by inconsistencies between the two or more analog to digital converters, from the digital signal.

According to this method, the offset level may be a generally zero DC offset, combining may be performed by a multiplexor, and a sub-channel gain mismatch compensation may be used to process the signal to remove gain mismatch between sub-channels in addition to processing to remove offset. Various sub-channel configurations are permitted as well. For example, in one embodiment, two or more sub-channels comprises four sub-channels. In another embodiment, two or more sub-channels comprises eight sub-channels.

In another embodiment of the system according to the invention, an analog to digital converter system configured to perform analog signal to digital signal conversion of an analog signal is provided. In one embodiment, this system comprises an input configured to receive an analog signal, two or more parallel analog to digital converters configured to process the analog signal to thereby generate one or more digital signals representing at least a portion of analog signal, two or more sub-channel gain mismatch compensation modules configured to process the digital signal to remove unwanted gain offset from the one or more digital signals to create processed digital signals, and a switch or multiplexer configured to received and combine the processed digital signals to create a signal digital signals representing of the analog signal.

In this embodiment, the analog digital converters may be associated with a sub-channel, and the analog to digital converters may be part of a time interleaved analog to digital conversion system. In addition, the sub-channel gain mismatch compensation modules may comprise an accumulator configured to generate the gain offset value, and a subtractor configured to remove the gain offset value from at least one of the one or more digital signals. A multiplier configured to receive a control value selected to control the rate of change of the accumulator may be provided as well.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 6 illustrates an example embodiment of a parallel ADC structure configured to mitigate mismatch between sub-channels or after distributed processing.

DETAILED DESCRIPTION

As a solution to the drawbacks in the prior art, disclosed herein is a method and apparatus to minimize DC offset, gain offset, interchannel skew. To overcome the drawbacks of the prior art and to achieve an effective high data transmit rate, an interleaved analog to digital converter is utilized in conjunction with a parallel processing structure to distribute the processing of a received signal. In one embodiment, a four-way interleaved analog to digital converter (A/D converter) is utilized such that each A/D converter operates at a clock rate that is lower than would be required for a system utilizing a single A/D converter. In addition, each of the sub-channels may utilize an independent processing path that provides the benefit of operation at a lower effective data rate, which in turn improves accuracy. However, although each processing path is intended and designed to be identical there are slight differences that exist in the processing path and hence, the effect that the processing has on each signal. Although there is a benefit to be gained by processing each sub-channel individually, these slight differences in processing result in signal anomalies and evidence themselves as differences in the signals found on each sub-channel. For example, as a result of the interleaved analog to digital conversion and the other distributed processing that occurs as a signal is processed on each sub-channel, unwanted signal mismatch may occur to the signals on the sub-channels. This signal mismatch may comprise one or more of DC offset, gain offset, and skew.

To overcome the drawbacks of gain offset, DC offset, and skew that may occur as a result of the distributed processing across sub-channels, the sub-channels may utilize one or more of a DC offset correction module, gain offset correction module, and de-skew system. These systems are discussed in more detail below.

Before discussing the particulars of the various embodiments of this method and apparatus, a discussion of an example environment of a communication system utilizing the invention may aid in understanding the invention. While it is contemplated that the method and apparatus described herein may be beneficially utilized in any communication system, it is also contemplated that numerous different systems will benefit from the advantages of the invention. By way of example and not limitation, the method and apparatus described herein may be utilized in any environment where high rate conversion of an analog signal to a digital signal is desired. Thus, environments that may benefit include, but are not limited to, video processing or display systems, computer processing or computer architectures, or audio processing systems, communication systems, or any other system or environment that utilizes a high rate analog to digital conversion process.

Figure 1:
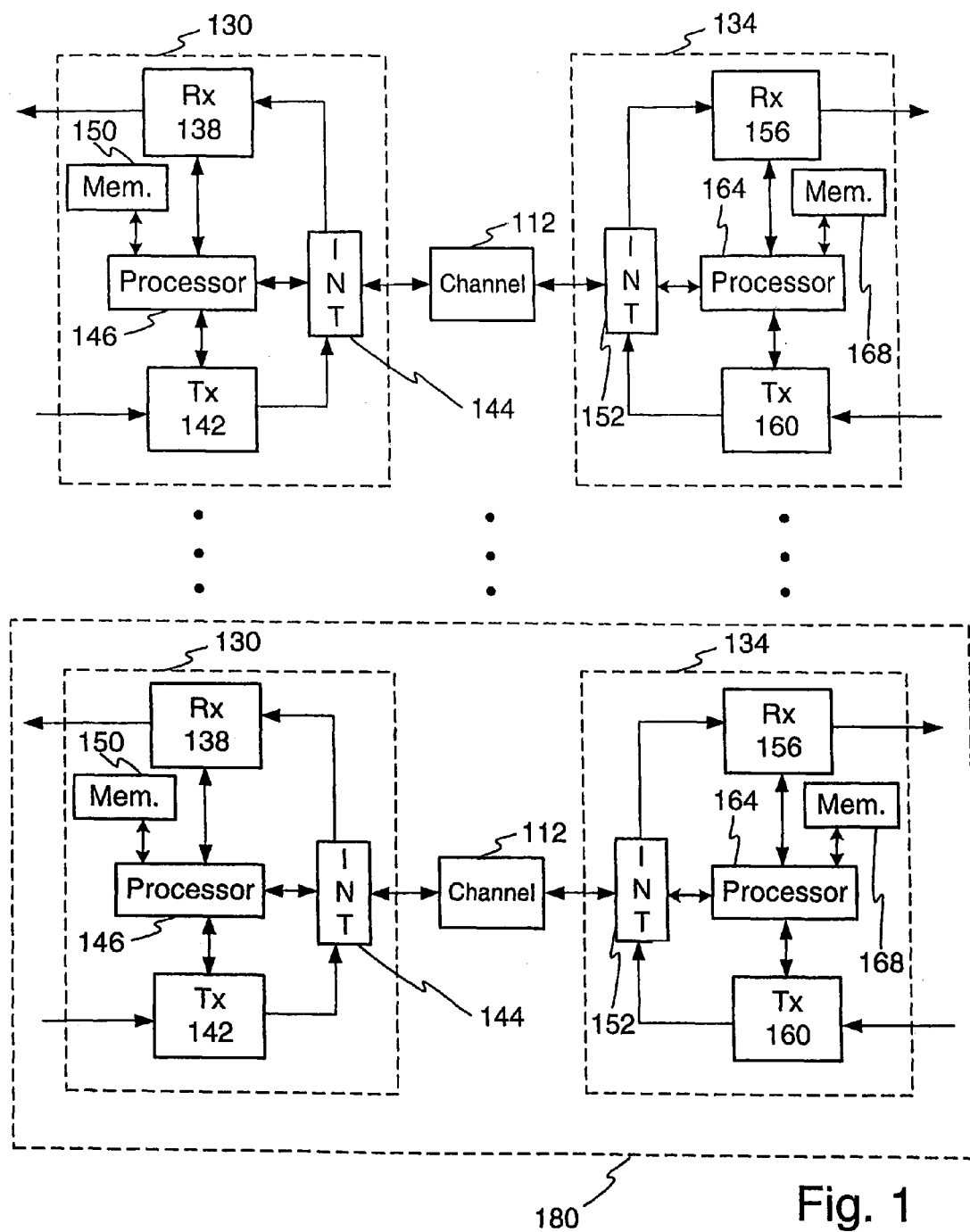
FIG. 1 illustrates a block diagram of an example environment of the invention.

Turning now to FIG. 1, an example environment of the method and apparatus is shown as a communication system configured to exchange data between remote locations. A block diagram of a receiver/transmitter pair is shown. A channel 112 connects a first transceiver 130 to a second transceiver 134. The first transceiver 130 connects to the channel 112 via an interface 144. The interface 144 is configured to isolate incoming from outgoing signals and may provide DC isolation. The interface may comprise a transformer. In one embodiment, the channel 112 may comprise numerous conductors, and hence, the interface 144 may perform isolation or separation of signals on the numerous conductors based on direction of data flow or based on connection to either of a receiver module 138 or a transmitter module 142. The receiver module 138 and transmit module 142 may comprise any assembly of hardware, software, or both configured to operate in accordance with the principles described herein or with any communication system or standard.

The receiver module 138 and transmit module 142 communicate with a processor 146. The processor 146 may include or communicate with memory 150. The memory 150 may comprise one or more of the following types of memory: RAM, ROM, hard disk drive, flash memory, or EPROM or any other type of memory or register. The processor 146 may be configured to perform one or more calculations or any type of signal analysis. In one embodiment, the processor 146 is configured to execute machine readable code stored on the memory 150. The processor 146 may perform additional signal processing tasks as described below.

The second transceiver 134 is configured similarly to the first transceiver 130. The second transceiver 134 comprises an interface 152 connected to a receiver module 156 and a transmitter module 160. The receiver module 156 and a transmitter module 160 communicate with a processor 164, which in turn connects to a memory 168.

The transformer configurations and associated circuitry shown and described herein may be located within the interfaces 144, 152 or at another location in the channel 112 or transceivers 130, 134. The transformer configurations and associated circuitry provide isolation between the one or more transmission lines or conductors and the other aspects of the transceivers 130, 134.

It is further contemplated that one or more additional transceivers and channels, shown as additional communication system 180 and shown within the dashed line, may operate in conjunction with the communication system shown at the top of FIG. 1. Each additional communication system 180 may be configured generally similar to that described above and hence, is not described in detail. It should be noted that the methods and apparatus described herein may be utilized in a single or multi-channel environment or in a sub-channel environment. The term sub-channel is defined to mean a separation or division of the content on a channel into two or more sub-channels. Sub-channels may comprise physically separate channels, or time, frequency, or coding divisions. In one example embodiment, each channel of a multi-channel communication system is divided into sub-channels aid in processing.

Figure 2:
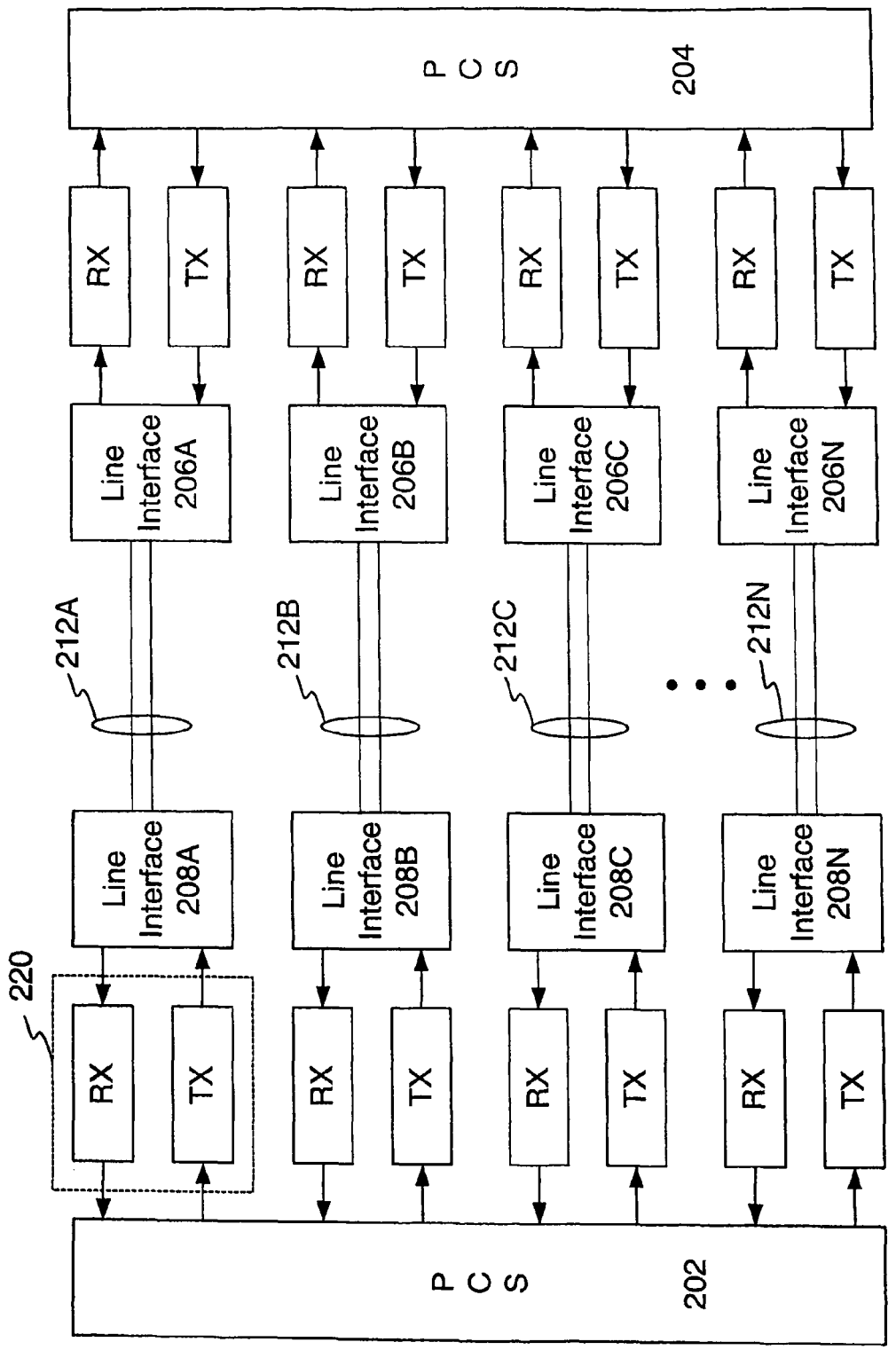
FIG. 2 illustrates a block diagram of an example environment of the invention.

FIG. 2 illustrates yet another possible example environment of the invention described herein. It should be noted that these example environments should not be considered as the only type systems that will benefit from the principles disclosed and claimed herein. It is contemplated that numerous high, low, or mid-frequency applications will benefit from the teachings of this patent. The communication system illustrated in FIG. 2 is configured as an exemplary multi-channel point-to-point communication system. One exemplary application is a 10 gigabit transceiver utilizing a Category 5 UTP cable supporting Ethernet protocols. As shown, it includes physical coding sublayers 202 and 204, shown as coupled over a channel 212. In one embodiment, each channel comprises twisted pair conductors. Each of the channels 212 is coupled between transceiver blocks 220 through line interfaces 208 and 206. Each channel is configured to communicate information between transmitter/receiver circuits (transceivers) and the physical coding sublayer (PCS) blocks 202, 204. Any number of channels and associated circuitry may be provided. In one embodiment, the transceivers 220 are capable of full-duplex bi-directional operation. In one embodiment, the transceivers 220 operate at an effective rate of about 2.5 gigabits per second thereby providing a 10 gigabit effect transfer rate. It is further contemplated that the channels 212 or the content on a channel may be further divided, separated, or allocated into sub-channels to achieve desired processing.

Figure 3:
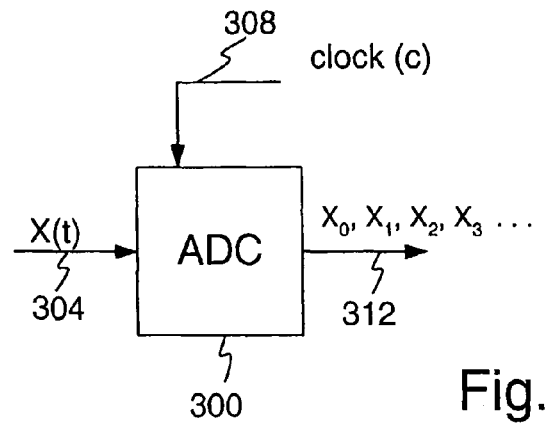
FIG. 3 illustrates an example embodiment of a prior art analog to digital converter.

FIG. 3 illustrates an example embodiment of a prior art analog to digital converter (ADC) 300. As shown, an input 304 defined by an analog input signal X(t), arrives at the ADC 300. Based on the timing of the clock signal CLK on clock input 308, the ADC 300 generates a corresponding digital signal on output 312. The output signal is defined by $X_0$, $X_1$, $X_2$, $X_3$, $X_4$, $X_5$, . . . . As discussed above, due to physical limitations, the ADC 300 may be unable to operate at the desired processing rate with the desired performance level. As a result, the structure of FIG. 4 may be utilized to distribute the processing of an analog to digital converter.

Figure 4:
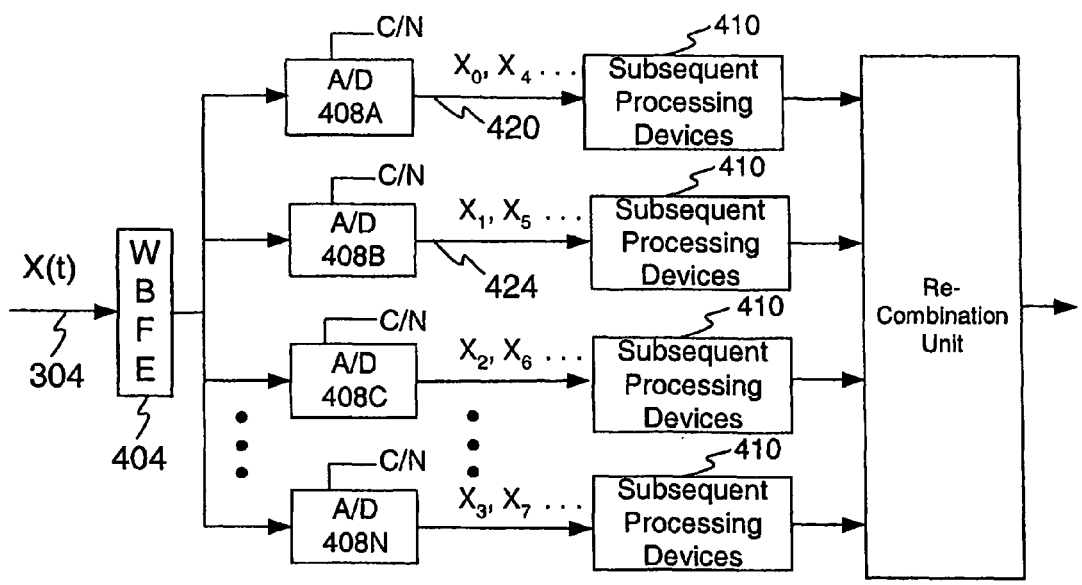
FIG. 4 illustrates an example embodiment of a distributed processing system.

FIG. 4 illustrates an example embodiment of a distributed analog to digital converter in accordance with the method and apparatus described herein. As shown, the input 304 provides an analog signal X(t) to a wide band front end (WBFE) 404. The WBFE 404 performs processing on the received signal. The output of the WBFE 404 feeds into two or more ADC's 408A, 408B, 408C, . . . 408N where N is any positive integer. Each ADC 408 may receive a clock signal defined by $C_0$, $C_1$, $C_2$, $C_N$. The clock signal, is generated from a primary clock C(t) 430 which may feed into the WBFE 404 and to a splitter 440. The splitter 440 is configured to divide the clock signal to create sub-clock signals, or generate sub-clock signals that are related to the primary clock 430. In one embodiment, the splitter 440 comprises phase splitter, one or more PLL with frequency dividers, or any other device capable of accurately generating one or more sub-clock signals.

It is contemplated that the sub-clock signal, hereinafter clock signal, may have a phase that is N degrees out of phase relative to at least one of the other clock signals and hence, each ADC 408 may operate on a different portion of signal X(t) as compared to the other ADCs. For the example of a primary clock being used to reference four sub-clock signals, the primary clock signal may be written as:

$$C_h = C\left(\frac{t}{N} - \frac{2n\pi}{N}\right) \text{ where } n = 0 \longrightarrow n-1$$

And, the four independent sub-clock signals may be written as:

$$C_0 = C\left(\frac{t}{4}\right)$$

$$C_1 = C\left(\frac{t}{4} - \frac{\pi}{2}\right)$$

$$C_2 = C\left(\frac{t}{4} - \pi\right)$$

$$C_3 = C\left(\frac{t}{4} - \frac{3\pi}{2}\right)$$

where each clock is 90 degrees out of phase.

As a result, the output of the ADCs 408 comprise digital signals that represent the analog signal yet which are spread over the N number of channels as shown based on the sub-clock signals. Thus, the first sub-channel 420 outputs samples $X_0$, $X_4$, $X_8$ . . . , while the second sub-channel 424 outputs digital samples $X_1$, $X_5$, $X_9$ . . . . The outputs on the sub-channels continue in this manner to thereby divide the signal X(t) into N number of parallel channels based on the individual but related sub-clocks.

In one example embodiment, there exist four A/D converters per channel 304 and each clock C/N has a 90 degrees shift such that the four clock signals are 90 degrees out of phase. This may also be referred to as a polyphase component clock signal. This results in each ADC sampling a different portion of the analog signal and allows each ADC to operate at a lower rate than in the embodiment of FIG. 3. Sampling may occur on the rising clock edge or the falling clock edge. This overcomes the drawbacks of the prior art thereby allowing the received signal to be converted with great precision into a digital signal.

It is fully contemplated that additional processing apparatus, which is not shown, may be present in the system of FIG. 4 to achieve desired processing. In addition, one or more of the signal paths shown in FIG. 4 may represent two or more parallel conductors.

Thus, the single high rate ADC of the prior art may be replaced by two or more parallel ADC that reduce the required rate of operation for each ADC. This allows the ADC system, shown by parallel ADCs 408 to achieve processing rates and performance levels that may meet specification. Notwithstanding the drawback discussed herein, such a configuration provides the benefit of low cost system capable of processing a high speed signal.

In addition to interleaved analog to digital conversion, additional processing may occur in distributed fashion across the N number of sub-channels. However, during the A/D conversion and during subsequent processing, unwanted mismatch differences may develop on each of the sub-channels that can interfere with subsequent processing, such as where interaction or interface between the sub-channels is necessary, or if it is necessary to recombine the sub-channels into a unified signal that is in either a serial or parallel format.

In one example embodiment, the system is configured to operate in an Ethernet environment utilizing four channels, each of which comprises twisted pair conductors. In this embodiment, each channel may be divided into four or more sub-channels. Thus, in an embodiment using four sub-channels per channel, sixteen ADC would process the signals received over the four twisted pair conductors to achieve the desired performance and processing rate. In another embodiment, each channel is divided into 8 ADC sub-channels thereby utilizing 32 ADCs.

As can be appreciated, with sixteen parallel sub-channels, each having similar, but independent, processing paths, it is likely that variations may exist between the signals on each of the sixteen channels due to slight differences in each processing path, device behavior, clocking differences, and/or a variety of other factors.

While the embodiment of FIG. 4 is an improvement over prior art systems that utilize a single A/D converter, it still suffers from the drawback of having signal mismatches that are generated as a result of the distributed processing. In reference to FIG. 4, each output from the ADC 408A, 408B, 408C, . . . 408N is processed by a different ADC and undergoes separate subsequent processing in devices 410. As a result, there may be minor differences between the output signals that make subsequent processing or recombination challenging or infeasible. The devices 410 may comprise any type processing device.

By way of example and not limitation, the ADC 408 may suffer from minute differences as a result in slight variations in the manufacturing process, each ADC 408 and subsequent processing devices 410 may operate slightly different based on changing temperature, or due to differences that may exist due to the variation in the manufacturing process. In turn, the output signal from each ADC 408 and the subsequent processing devices may not be identical, even though generated by an identical input signal. In systems requiring precision, the differences may be sufficient to impede subsequent processing or successful recombination, such as in a re-combination unit. For example, the parallel ADC 408 and the subsequent processing units 410 may cause the signal to suffer from gain offset or gain error, bias offset or DC offset, and skew mismatch.

To aid in understanding, gain offset comprises differences between the gain levels, i.e. magnitude, of each output signal. In short, each of the processing paths, i.e. the combined effects of the ADC 408 and the subsequent processing devices 410, may generate a signal having a slightly different magnitude as compared to the signal on the other paths. Thus, in a parallel processing system, the difference in gain between the parallel processing path creates signal mismatches that could hinder subsequent processing and/or recombination of the signals on the sub-channels.

Figure 5A:
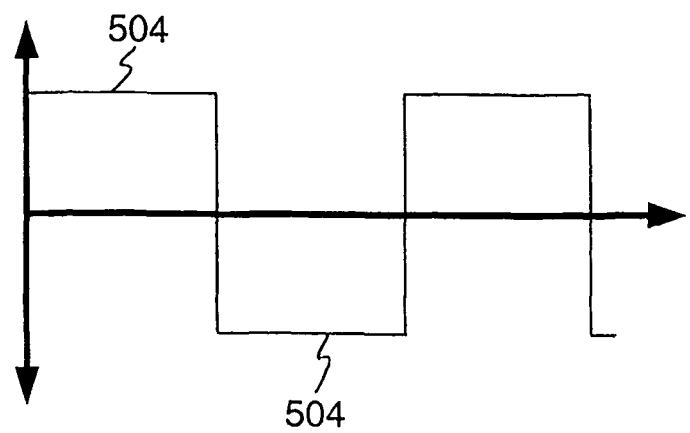
FIGS. 5A through 5C illustrate various plots of signals in various stages of processing and the effect of mismatch between distributed systems.
Figure 5B:
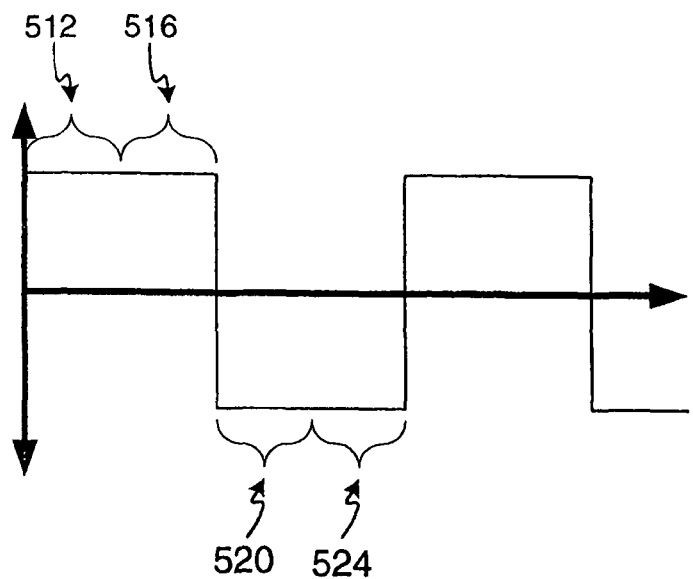
Figure 5C:
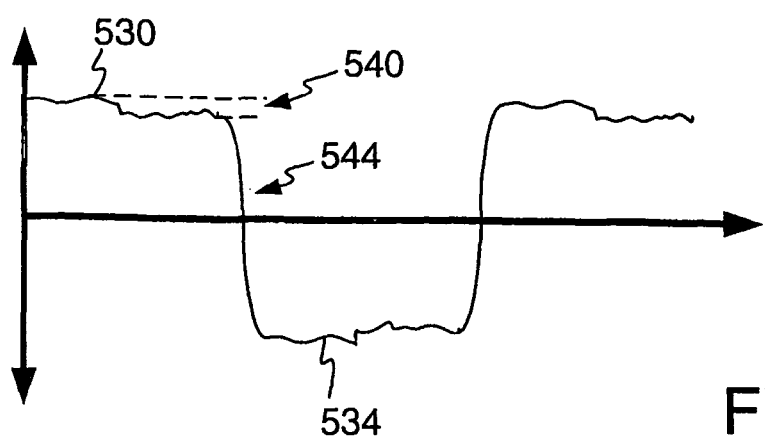

FIGS. 5A-5C illustrate exemplary signal mismatches that may result from gain offset, DC offset, or skew. FIG. 5A shows a plot of an exemplary desired digital output signal. As can be seen, the signal portion 504 is generally constant over time.

As shown in FIG. 5B, the signal 504 when parallelized onto sub-channels may be represented as two or more outputs 512, 516, 520, 524 of a parallel ADC structure or subsequent processing devices. FIG. 5B illustrates an ideal representation of the signal that has been divided into four portions, as would be present on the four sub-channels, if recombined. Hence, the original signal 504 is now shown in an ideal or desired format as being divided into signal portions 512, 516, 520, 524 by the signal outputs shown in FIG. 5B. These signal portions 512, 516, 520, and 524 may be generated by different, but parallel processing paths. Although the four portions 512, 516, 520, 524 are shown as ideal output values, i.e. they are all perfectly matched, in actual practice, the different processing paths, and the processing on these paths, results in slight mismatches in these signals.

Thus, in actual practice, the signal on a processing path may suffer from signal mismatch, as compared to the signals on the other processing paths, which may be referred to as sub-channels. These signal mismatches may lead to errors when performing subsequent processing or re-combining the signals on the sub-channels.

FIG. 5C illustrates an example of a signal generated as a result of re-combining signals suffering from mismatch. As can be seen, the signal portions 530, 534 are not generally consistent (smooth) over time since each of the sub-channels may have different gain offset, bias offset, or skew.

In addition, signal portions 530, 532 vary in magnitude over time. Hence, there is a gain offset or DC offset 540 shown between adjacent signal portions 530, 532. Skew is shown by the non-vertical transition 544 between logic values. Thus, the final output after combination of the sub-channel signals varies over time. This problem, when the precision requirements of the communication system are increased, leads to errors, undesired operation, and degradation in performance.

Stated another way, if each output of each of the four ADCs is defined by a gain value $g_x$ where x represents the particular ADC and each ADC generates a value per clock cycle then the output signal, if recombined may consist of four different output values for an identical input, such as $g_1$, $g_2$, $g_3$, $g_4$. Thus, when recombined the resulting signal may undesirably consist of four different values. This problem is made worse when the number of parallel ADCs is increased or when the number of samples contributed from each ADC is increased.

An additional possible consequence of the processing done by the embodiment shown in FIG. 4 is bias offset. In contrast to gain offset, which affects the magnitude of a sample's positive and negative swing, bias offset shifts the entire signal. Hence, a signal suffering from bias offset is shifted in magnitude in the bias offset direction. It is contemplated that both positive and negative sample values may be biased in the direction of the bias offset. It is also contemplated that each processing path may introduce a different bias offset. Bias offset hinders system operation by causing each of the processing paths to output different values in response to an identical input signal.

It is contemplated that as a result of the distributed ADC processing, and the other processing that occurs independently on each sub-channel, one or more of the signals within the communication system may be out of phase. For example, in a multi-channel communication system, skew may be undesirably introduced which in turn disturbs the phase relation between the signals on the multiple channels. In addition, if a channel is interleaved into sub-channels, then skew may also be introduced across the signals on the sub-channels. The skew may be introduced or exist for numerous reasons including, but not limited to, interleaved analog to digital conversion, and/or slight clock errors. For example, it may be impossible or prohibitively expensive or complex to generate sub-clock signals that are exactly in phase or to create ADCs that operate exactly identical. In some instances, the manufacturing process of the integrated circuits may create a slight mismatch. The solution disclosed herein may find use in any environment and to address skew, regardless of the source or cause of the skew.

Figure 9:
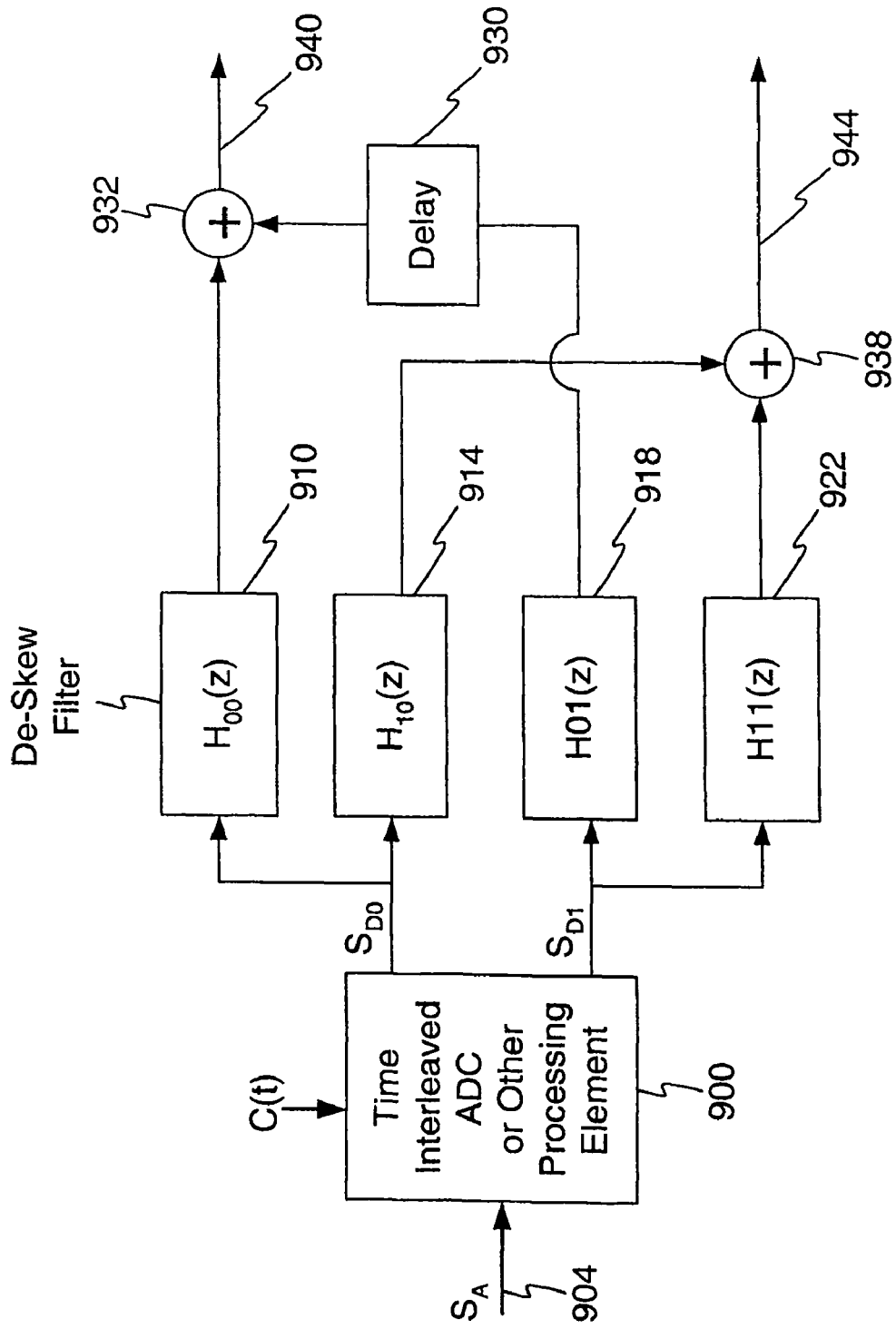
FIG. 9 illustrates a block diagram of an exemplary embodiment of a two channel de-skew system configured to eliminate or greatly reduce inter-channel skew.

To overcome the skew that may exist between channels, it is contemplated that the structure of FIG. 9 may be adopted to adjust the phase of the signals on the sub-channels. FIG. 9 illustrates an exemplary two channel de-skew embodiment configured to eliminate or greatly reduce inter-channel skew. Although shown in a two channel environment, it is contemplated that this concept for skew correction may be expanded to any number of channels. In general, one or more filters are utilized to process the signals to remove unwanted skew. In one embodiment, one or more filters are associated with each channel and configured to perform de-skew processing. As an advantage, certain filters may already be provided within a communication system to perform signal processing that mitigates signal anomalies other than skew. Modification of these filters or adding additional filters may provide for de-skew processing. This departs from prior art motivations which generally avoid increasing the complexity of a communication system by adding one or more additional filters and/or delays to the processing associated with the channels or sub-channels. In addition to the other novel aspects disclosed herein, use of one or more digital filters configured as FIR filters or IIR type filters to perform de-skew processing is considered an improvement over prior art methods.

As shown in FIG. 9, a time-interleaved ADC 900 is configured to receive and process an analog signal $S_A$ to create a digital signal $S_{D0}$ and $S_{D1}$ which are associated with channel 0 and channel 1 as shown. A clock signal C(t) 904 may be provided to the time-interleaved ADC 900 as shown or generated within the ADC. The operation of the time-interleaved ADC 900 is described above and hence, not described again other than the analog signal is time-interleaved into two output signals $S_{D0}$ and $S_{D1}$. It is contemplated that other processing devices, which are not shown in FIG. 9, may be associated with each channel or sub-channel and that these additional processing devices may also introduce the skew between signals.

The digital signals $S_{D0}$ and $S_{D1}$ are provided to one or more de-skew filters 910, 914, 918, 922. In particular, filter $H_{00}(z)$ 910 and filter $H_{10}(z)$ 914 process signal $S_{D0}$ while filter $H_{01}(z)$ 918 and filter $H_{11}(z)$ 922 process signals $S_{D1}$. The filters 910, 914, 918, 922 may comprise any type filter or other signal processing device configured to modify the phase or amplitude or both of the output from the time interleaved ADC 900. In one embodiment, the filters 910, 914, 918, 922 comprise digital filters configured as FIR filters or IIR filters, or a combination thereof. In addition, the filters 910, 914, 918, 922 may possess any number of taps or filter coefficients depending on the particular application and desired resolution. In one embodiment, the coefficient(s) comprise a scalar capable of modifying the phase and magnitude of a signal. In one embodiment, the filters 910, 914, 918, 922 are configured to mitigate inter-channel skew. In one embodiment, the system shown in FIG. 9 is configured as part of a communication system and also configured to account for intersymbol interference that occurs during transmission of the analog signal through a channel. Thus, the filter structure shown in FIG. 9, may be configured to mitigate the effects of the signal's transmission through the channel, and also be configured to mitigate skew.

The output of filter 918 feeds into a delay 930 which in turn have a delayed output that feeds into a junction 932 that is configured to combine the output of the delay 930 and the output of filter 910. The resulting signal is provided on output 940 to and comprises a digital signal representing $S_{D0}$ but which will not suffer from skew in relation to the other channel(s) after processing of the other channel(s). A junction 936 combines the output of filter 914 and filter 922 to create a signal on output 944 representing the signal $S_{D1}$ but which does not suffer from skew in relation to the other processed channel. The junctions 932, 938 may be configured as summing junctions.

In operation, after time interleaved A/D conversion and other processing, the digital signals $S_{D0}$ and $S_{D1}$ may suffer from skew in relation to each other and hence, it may be desired to remove such skew to achieve desired processing or to eventually re-combine the signals into a single high rate digital signal or both. The signals $S_{D0}$ and $S_{D1}$ may be considered as containing even and odd samples, respectively. In one embodiment, prior to operation, the filters 910, 918 are trained concurrently or as a pair while filters 914, 922 are also trained concurrently or as a pair. As a result, the coefficients of the filters are selected to modify a received signal to thereby generate outputs, that when combined, reduce or eliminate skew between channels. It is further contemplated that the filters 910, 914, 918, 922 may also be configured to account for and mitigate intersymbol interference. Any type training or adaptation may be utilized, such as, but not limited to, adaptation utilizing the least mean square algorithm. Adaptation and training of filters is understood by those of ordinary skill in the art, and hence, is not discussed in detail herein.

During operation and after training, signal $S_{D0}$ is provided to de-skew filter 910 and de-skew filter 914. In such an embodiment, the filter 910 is configured to precisely adjust the phase of the received signal $S_{D0}$ to account for skew originating in channel 0. As such, filters 910 have a transfer function $H_{00}(z)$ which is defined as a transfer function that accounts for or mitigates phase error affecting channel 0 (victim) and which originates from channel 0 (source). Similarly, filter 918 is configured with a transfer function $H_{01}(z)$ which is defined as a transfer function that accounts for or mitigates phase error affecting channel 0 and originating from channel 1. Filter 918 is configured to modify the signal $S_{D1}$ such that when combined with the output of filter 910, the resulting signal does not suffer from skew as compared to the signal on output 944. The delay 930 serves to align the samples for combination at junction 932 to account for the delay that may originate in the filters 910, 914, 918, 922 or other element.

To generate the signal on output 944, filter 914 processes signal $S_{D0}$ while filters 922 process $S_{D1}$. As described above, together these filters modify the received signals such that when the filter outputs are combined the resulting signal output from junction 938 does not suffer from skew as compared to the signal $S_{D1}$ output from the ADC 900. In one embodiment, the filters are operating in a polyphase format and, as such, it is beneficial to receive filtered input from the other channels to thereby reconstruct the signal associated with a particular channel, based on all the received signals. By receiving the input from the other channels, the desired signal may be modified as desired thereby overcoming effects of processing at a sub-sampling rate.

In various other embodiments, it is contemplated that the one or more filters may be configured to adjust the amplitude or other aspects of the signals $S_{D0}$ and $S_{D1}$. It is also contemplated that these principles may be applied to any number of channels and hence, although two channels are shown, it is contemplated that this principle may be applied to greater than two channels without departing from the scope of the claims that follows. As a result of the processing shown and described in conjunction with FIG. 9, the high speed analog signal may be accurately and precisely converted to two or more time-interleaved digital signals and the resulting time-interleaved digital signals may be subsequently processed to remove unwanted skew and/or other anomalies.

Figure 10:
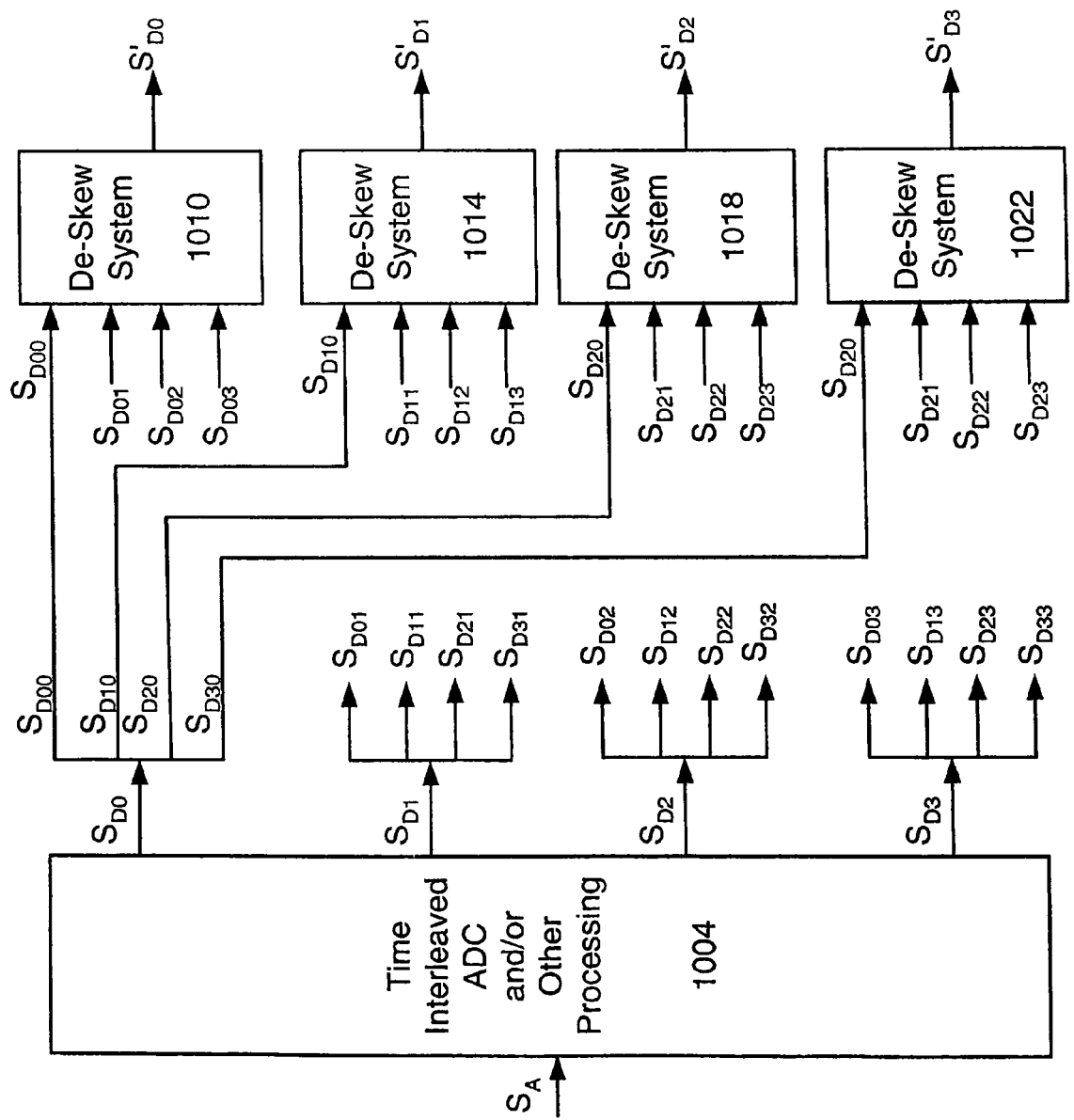
FIG. 10 illustrates a block diagram of an example embodiment of a four channel de-skew system.

FIG. 10 illustrates a block diagram of an example embodiment of a four channel de-skew system. As shown, an analog signal $S_A$ is provided to a time interleaved analog to digital converter and/or other processing device 1004 that is configured to convert a high speed analog signal into a greater number of time-interleaved digital signals. In this example embodiment, the single analog input is interleaved into four sub-channels as shown here. Although not shown, it is contemplated that additional processing may be performed on each sub-channel and that this processing may also introduce skew across the signals on the channels and/or sub-channels. Other signal anomalies may also be introduced. The output of the time-interleaver 1004 comprises four digital signals $S_{D0}$, $S_{D1}$, $S_{D2}$, $S_{D3}$. This process is described above in greater detail and hence, not described again.

Although the four signals $S_{D0}$, $S_{D1}$, $S_{D2}$, $S_{D3}$ represent the analog signal, each of the signals is intended to be out of phase in relation to another signal by 90 degrees (corresponding to a four sub-channel interleaving), but due to skew, each signal may not be out of phase by the proper amount from any of the signals on the other channels. For example, there maybe 88 degrees or 89 degrees phase mismatch between signals on adjacent channels instead of 90 degrees. As a result, it is desired re-align the signals to eliminate or greatly reduce the skew.

As shown, each of the signals $S_{D0}$, $S_{D1}$, $S_{D2}$, $S_{D3}$ is routed to de-skew systems 1010, 1014, 1018, 1022. In particular, the signal $S_{D0}$ is routed to each de-skew system 1010, 1014, 1018, 1022. The notation shown as $S_{D10}$ represents that the digital signal $S_{D0}$ is routed from channel 0 to the de-skew system associated with channel 1. Likewise, the signal routing path $S_{D31}$ represents a routing of signal $S_{D1}$ from channel 1 to channel 3.

The de-skew systems 1010, 1014, 1018, 1022 are configured to uniquely process the received digital signals $S_{D0}$, $S_{D1}$, $S_{D2}$, $S_{D3}$ to thereby generate signals that do not suffer from skew as compared to the other signals. As a result, the de-skew system output is out of phase by the desired amount.

In one embodiment, the de-skew systems 1010, 1014, 1018, 1022 comprise a combination of one or more filters, summing or subtracting junctions, and one or more delays. In other embodiments, it is contemplated that the de-skew systems 1010, 1014, 1018, 1022 may comprise a processor and associated software or any other device or system. Although not shown, communication may occur between de-skew systems. It is further contemplated that the de-skew systems 1010, 1014, 1018, 1022 may be further configured to mitigate other distortion or inconsistencies between the digital signals $S_{D0}$, $S_{D1}$, $S_{D2}$, $S_{D3}$ such as, but not limited to, differences in amplitude, gain, or bias settings, or deal with intersystem interference or other signal distortions.

The output of the de-skew systems 1010, 1014, 1018, 1022 comprise digital signals $S'_{D0}$, $S'_{D1}$, $S'_{D2}$, $S'_{D3}$ which due to the processing of the de-skew systems 1010, 1014, 1018, 1022 comprise the digital signals $S_{D0}$, $S_{D1}$, $S_{D2}$, $S_{D3}$ but without the unwanted skew between channels.

Figure 11:
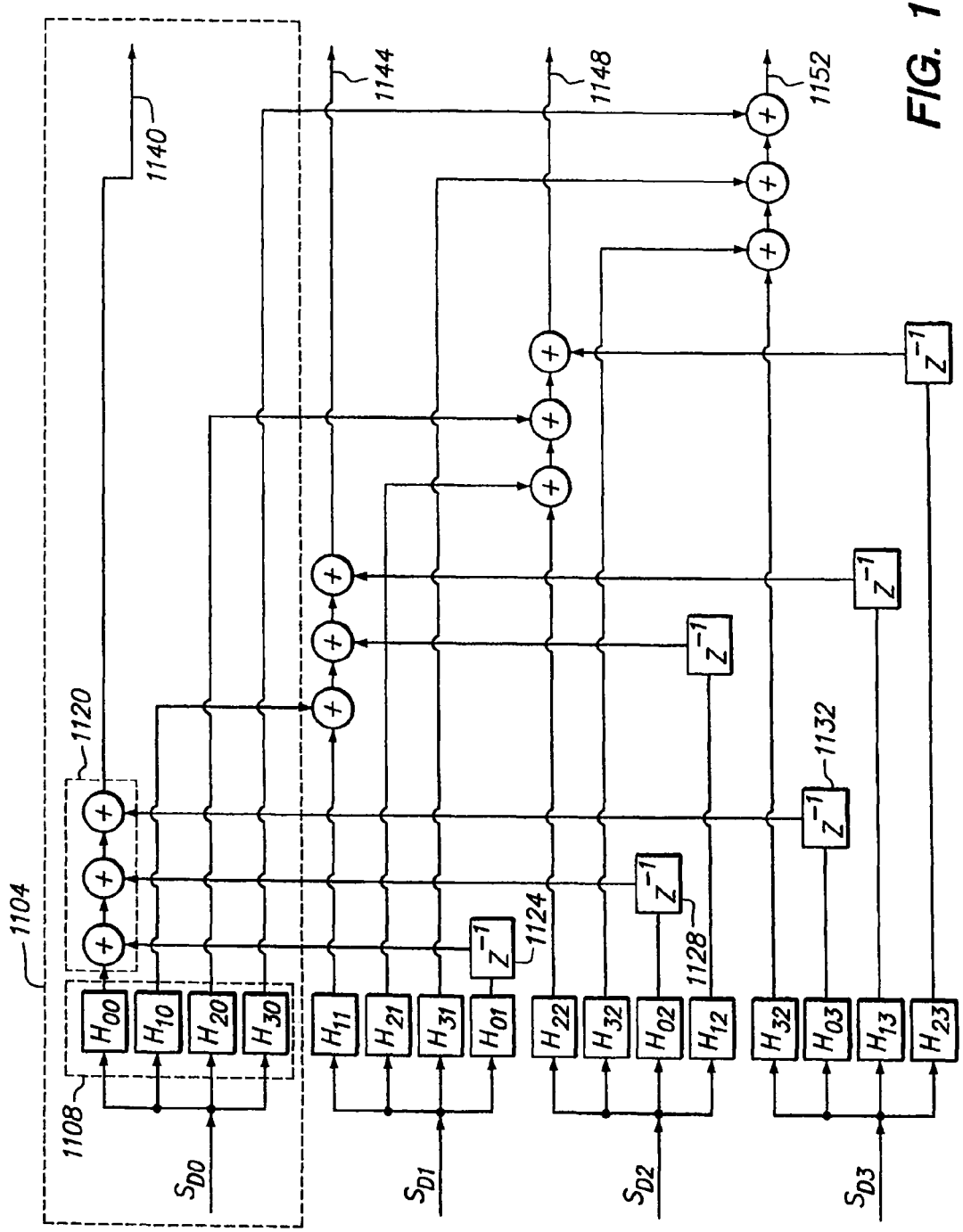
FIG. 11 illustrates a detailed block diagram of an example embodiment of a four channel de-skew system.

FIG. 11 illustrates a detailed block diagram of an example embodiment of a four channel de-skew system. This is but one example embodiment and it is contemplated that one of ordinary skill in the art may arrive at other embodiments that differ from this embodiment yet do not depart from the claims that follow. To aid in understanding, a single channel is described in detail. The other channels are generally similar in construction, although the filters H associated with a channel may have different coefficient values. The structure shown may be provided for other channels, and this concept may be expanded to any number of channels. Although not shown, it is contemplated that a time interleaved analog to digital converter or any other processing system may provide the signal signals $S_{D0}$, $S_{D1}$, $S_{D2}$, $S_{D3}$ to the de-skew system of FIG. 11.

In reference to a channel 0 system 1104, an input $S_{D0}$ is provided to a filter bank 1108. In the embodiment shown in FIG. 11, the filter bank 1108 comprises a filter configured to process the signal $S_{D0}$ to create a signal tailored for each of the channels 0-3. Thus, filters in the filter bank 1108 generate outputs comprising a processed version of the signal $S_{D0}$ and these outputs are tailored by the filters in the bank 1108 to mitigate skew between signals on the channels. For example, the output of filter $H_{00}$ comprises the primary components of the signal $S_{D0}$ with an optional degree of processing. Filter $H_{10}$ generates an output comprising a processed version of the signal $S_{D0}$ that is tailored to supplement or modify the signal on channel 1. Filter $H_{20}$ generates an output comprising a processed version of the signal $S_{D0}$ that is tailored to supplement the signal on channel 2. Filter $H_{30}$ generates an output comprising a processed version of the signal $S_{D0}$ that is tailored to supplement the signal on channel 3.

The output of filter $H_{00}$ is provided to a junction bank 1120, which may comprise summing junctions. The bank 1120 comprises one or more junctions configured to combine the output of filter $H_{00}$ with the supplementing signals from the other channels, in this embodiment, channels 1, 2, and 3.

A delay 1124 provides a delayed version of a filtered version of signal $S_{D1}$ to the junction bank 1120. A delay 1128 provides a delayed version of a filtered version of signal $S_{D2}$ to the junction bank 1120. A delay 1132 provides a delayed version of a filtered version of signal $S_{D3}$ to the junction bank 1120.

The output of the junction bank 1120 comprises a modified version of the signal $S_{D0}$. The configuration of filters, summing junctions, and delays associated with the other channels 1-3 is generally similar to that described for channel 0 and thus, is not described in detail.

After processing occurs in this manner shown for each of the channels and through appropriate training and adaptation of the filters $H_{xx}$, the resulting signals on outputs 1140, 1144, 1148, 1152 do not suffer from skew or skew is greatly reduced. The amount of skew may be controlled by the complexity of the filters H and the particular needs of the system.

In operation, the filters are trained to generate signals, which when combined with the filtered signals from the other channels in the junction banks, and delayed as shown to maintain alignment between time-interleaved samples, do not suffer from skew. This results in a known and intended amount of phase difference between sub-channels. In one embodiment, the filters $H_{00}$, $H_{01}$, $H_{02}$, and $H_{03}$ are trained together to generate the desired signal on output 1140. Training may occur based on the error term of a decision device, such as a slicer (not shown in FIG. 11) which may be fed back from subsequent signals. For example, in certain embodiments a phase error feedback signal may be generated and fed back for training and adaptation. In addition, the filters may be trained to account for or mitigate other unwanted distortion such as, but not limited to, gain mismatch resulting from the time-interleaved ADC or inter-symbol interference.

It is also contemplated that in addition to skew mismatch between signals on different channels, other factors may undesirably affect the signals. For example, gain mismatch and DC offset may be present.

FIG. 6 illustrates an example embodiment of a communication system configured with gain offset and DC offset mitigation. In comparison to FIG. 4, similar elements are identified with identical reference numbers. In this example embodiment, a channel is divided or interleaved into two or more sub-channels. As shown, the input signal X(t) is first processed by the WBFE 404 and then provided to a device 600 configured to perform time interleaved ADC and/or other processing. It is contemplated that in the embodiment shown, the device 600 may comprise four ADCs and each ADC may operate at a rate that is less than the rate of the input signal X(t). In one embodiment, the rate is 1/Nth the rate that would be required if a parallel processing arrangement was not adopted where N is the number of sub-channels.

The output of the processing device 600 feeds into a DC loop (DCL) 604A, 604B, 604C, ... 604N, where N represents the number of sub-channels and may comprise any positive integer. A DCL 604 comprises processing apparatus configured to remove or mitigate the bias offset from a signal on each sub-channel. By removing the bias offset, accuracy is improved during subsequent processing and signal recombination, if so desired, may be achieved. The term bias offset is defined to mean a difference in the bias level as compared between the sub-channels, differences in bias level as compared to a reference value, or both. The method and apparatus described herein may be configured to mitigate or remedy all forms of bias offset.

In one embodiment, the DCL 604 estimates the mean of the signal and, based on the mean, removes the unwanted bias offset from the signal, which is to say removes signal portions that vary from the mean. In one embodiment, the DCL is implemented as a high order filter. Example embodiments of DCLs 604 are shown and discussed below.

In this example embodiment, the output of the DCL 604 is provided to and processed by two or more sub-channel gain mismatch compensation modules (SCGMC) 608A, 608B,

608C, . . . 608N. The SCGMCs 608 are configured to mitigate or remove the gain offset from each channel. The gain offset may comprise differences in gain between sub-channels, differences as compared to a reference value, or both. Details regarding the SCGMC 608 are discussed below in greater detail.

The output of the two or more SCGMC 608 may connect to or eventually feed into a digital signal processor 624. Due to the nature of the processing within the DSP 624, it is desired to minimize or eliminate bias offset and gain offset prior to processing by the DSP 624 or other device. This is particularly true if the signals on the multiple channels are to be recombined, or if processing across channels is to occur.

It is also contemplated that the output of the two or more SCGMC 608 may connect to or eventually feed into a multiplexer for recombination into a single signal. In one embodiment, the multiplexer processes the N number of sub-channels into fewer than N channels. In one embodiment, the N sub-channels are mixed into a single channel for subsequent processing by the DSP 624. Due to the processing by the devices 600, DCLs 604, and SCGMCs 608, the signal output from the MUX is an accurate digital format representation of the signal X(t).

This is but one example embodiment of a multiple sub-channel structure with bias offset and gain offset mitigation. It is contemplated that one of ordinary skill in the art may generate alternative embodiments that do not depart from the claims. It is contemplated that the embodiment of FIG. 6 may be implemented with only the DCLs 604 or only the SCGMC 608 based on the distortion contained in the output of the time interleaved ADC 600.

As an advantage to the structure shown in FIG. 6, the DCL 604 and the gain mitigation devices 608 may be shared between both the DSP 624 and the ADC and associated processing. By sharing the devices 604, 608, the gain offset and bias offset associated with sub-channel processing may be mitigated. As compared to an alternative embodiment which may associate bias offset and gain offset with both the ADC aspects and the DSP, the embodiment of FIG. 6 utilized a shared structure to achieve generally identical or equivalent processing benefits and effect while reducing components.

Figure 7A:
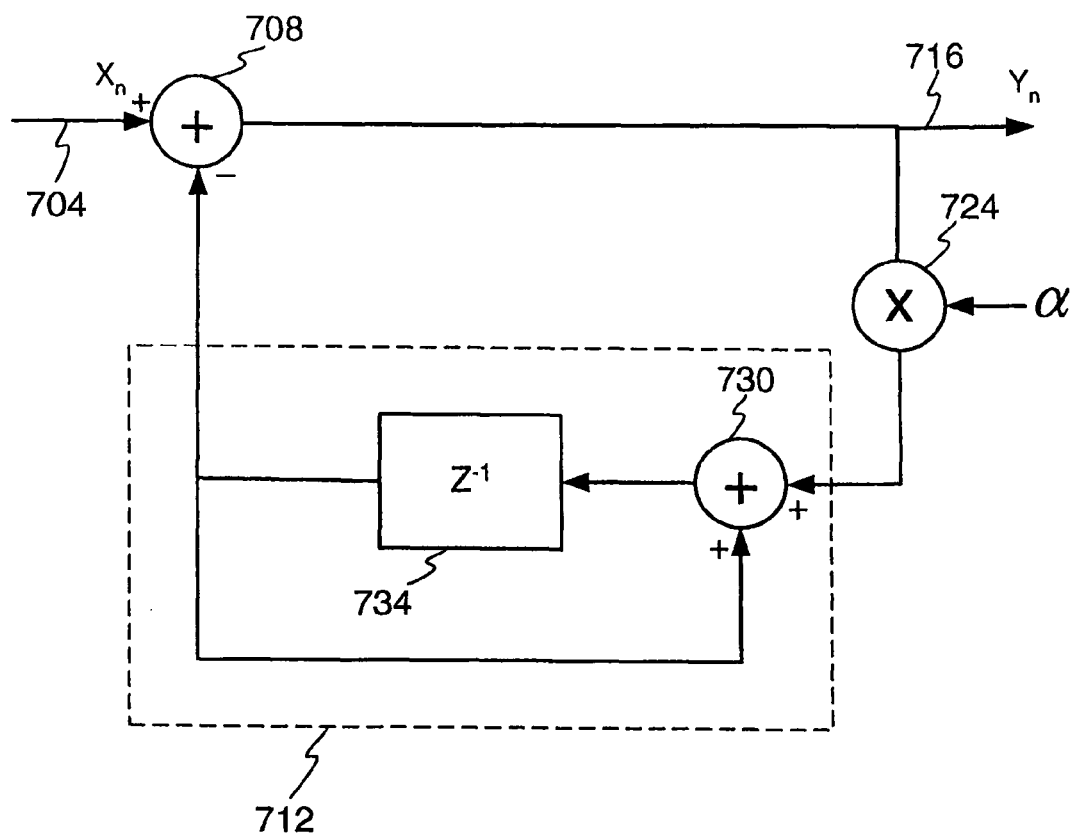
FIG. 7A illustrates a block diagram of an example embodiment of a DCL.

Turning now to FIG. 7A, an example embodiment of a DCL is shown. This is but one example embodiment and it is contemplated that one of ordinary skill in the art may be able to enable a DCL that differs from this particular embodiment yet does not depart from the scope of the invention as defined by the claims. As with all embodiments and systems shown herein, the paths within the DCL and the accumulator 712 may comprise two or more parallel conductors or connections. The DCL receives a signal $X_n$ on input 704. Input 704 feeds into a junction 708. The junction 708 comprises a device configured to combine two or more signals, either by addition, subtraction, or some other manner. The junction 708 also receives an input from an accumulator 712, shown in a dashed line enclosure, which is discussed below in more detail.

The output of the junction 708 is provided as an output signal $Y_n$ on output 716 and as an input to a multiplier 724. The multiplier 724 also receives as an input a value $\alpha$ where $\alpha$ represents a control value that determines the rate of change of the accumulator 712. In one embodiment, the multiplier 724 and value $\alpha$ control the rate of training of the accumulator. The value of $\alpha$ may change over time. In another embodiment, the control value $\alpha$ is provided to an accumulator 712. The multiplier output connects to or is in communication with the accumulator 712 as shown.

The accumulator 712 is now described. In this example embodiment, the accumulator 712 comprises a junction 730 configured as a summing junction and a delay element 734. The output of the multiplier 724 feeds into the junction 730. The junction 730 also receives as an input a feedback signal from the delay 734. The output of the junction 730 feeds into the delay element 734, the output of which is the input to the junction 708. At junction 708, the accumulator output is subtracted or removed from the incoming signal $X_n$.

During operation of this example embodiment, the incoming signal is desired to have a mean signal value of zero and a bias offset of zero. Thus, the DCL as shown in FIG. 7 removes the bias offset. An incoming signal $X_n$ arrives on input 704 at the junction 708, where the accumulator value is subtracted. Assuming at start-up the accumulator value is zero, the output of the junction 708 is then equal to $X_n$. The $X_n$ value is provided to the multiplier 724 where it is reduced, increased, or otherwise modified in relation to $\alpha$ and provided to junction 730 within the accumulator 712. The feedback from the delay at this point in operation is zero, unless the delay is preloaded. Over time the accumulator 712 generates a value that approximates the bias offset due to the feedback delay structure. The bias offset is then subtracted from the incoming signal $X_n$ in the junction 708. In this manner, the bias offset is removed from the signal $X_n$ thereby maintaining a mean of zero for $X_n$ over time as desired. When applied to each output of the time interleaved ADC, the bias is removed from each sub-channel, which in turn provides the benefits described herein. In one embodiment, this provides for an accurate combination of the parallel sub-channels to create a combined output signal that has a uniform and consistent output value for a given input value.

Figure 7B:
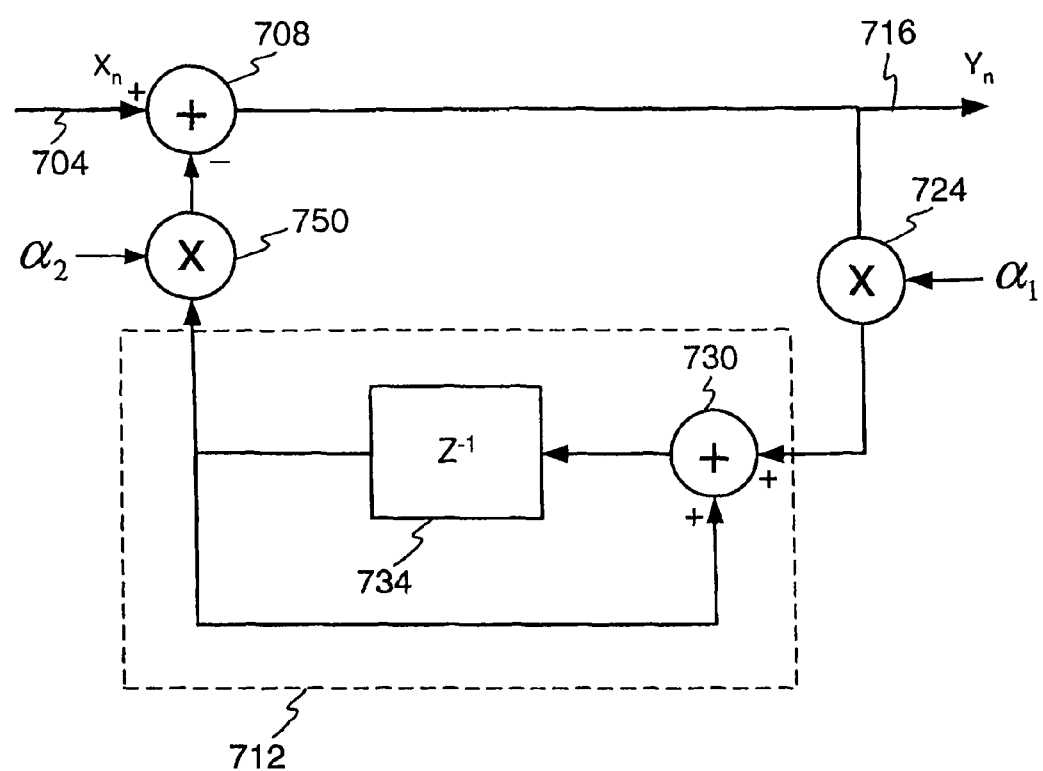
FIG. 7B illustrates a block diagram of an example embodiment of a DCL with dual multipliers.

FIG. 7B illustrates an example embodiment of a DCL with dual multipliers. The embodiment of FIG. 7A may be ideally suited in a floating point environment whereas the embodiment shown in FIG. 7B may be ideally suited to a fixed point environment. The term floating point defines an environment wherein the decimal point in a numeric value may float thereby allowing for representation of very small numbers. In contrast, the term fixed point defines an environment where the decimal point in a numeric value is fixed at a particular point thereby making the representation of very small numbers challenging. As a result, the system of FIG. 7B scales a small number to a larger value to achieve desired processing and thereafter rescale the processed numeric value to a small value. The concept of fixed point and floating point numeric representations are known in the art and hence, not described in great detail herein. As compared to FIG. 7A, identical elements in FIG. 7B are identified with identical reference numerals. In addition, only the aspects of FIG. 7B that differ from FIG. 7A are discussed.

In contrast to FIG. 7A, the embodiment of FIG. 7B includes a second multiplier 750 located between the accumulator 712 and the junction 708. In this embodiment, the control value provided to the first multiplier 724 comprises $\alpha_1$ and the control value provided to the second multiplier 750 comprises $\alpha_2$. The second multiplier 750 utilizes the value $\alpha_2$ to scale the output of the accumulator 712. In one embodiment, the control value $\alpha_1$ represents a value greater than one that increases the value of the feedback provided to the accumulator 712. This increases this value so that processing may occur without rounding errors or multiplication operations that result in zero values. Then after processing by the accumulator 712, the second control value $\alpha_2$ reduces the feedback value back to the appropriate level for combination in the summing junction 708. It is contemplated that the second multiplier 750 may also comprise a divider, which may be made to have a similar function to a multiplier, or any other apparatus or device configured to achieve the goals set forth herein.

Figure 7C:
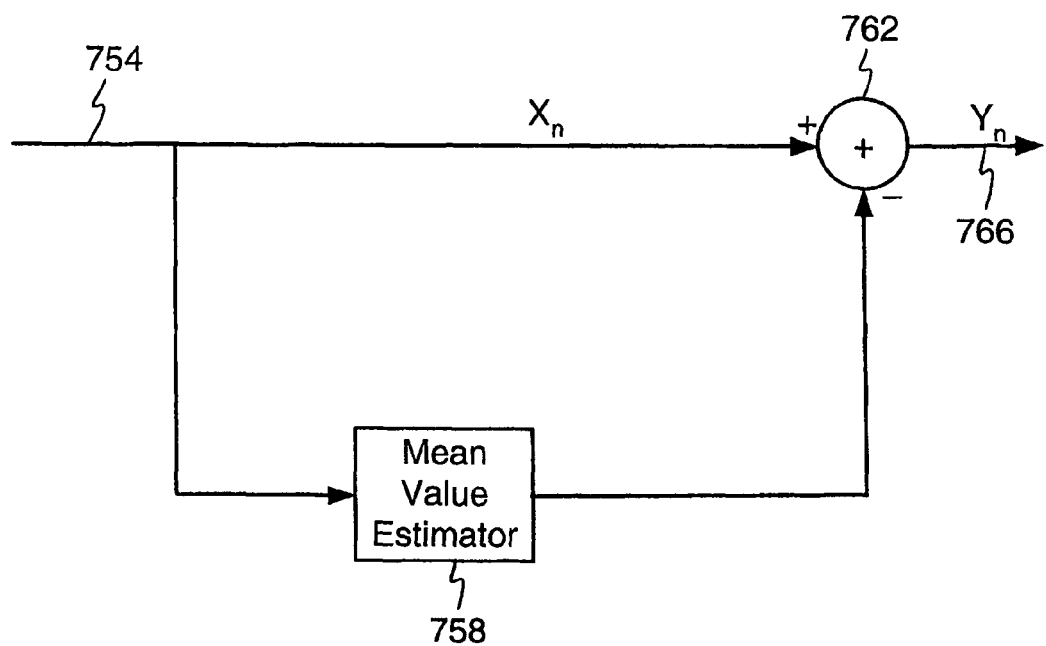
FIG. 7C illustrates a block diagram of an example embodiment of a feed forward configuration for DC offset correction.

FIG. 7C illustrates an example embodiment of a feed forward configuration for DC offset correction. An input 754 connects to a mean value estimator 758 and a junction 762. The mean value estimator 758 comprises a device configured to calculate the mean value of the signal $X_n$ received over input 754. In one embodiment, the mean value estimator 758 comprises, alone or in any combination, a processor, logic, ASIC, subtractor, comparator, summing junction, control logic, software code, or any other element as would be understood in the art to perform the desired function. The output of the mean value estimator 758 is subtracted from the received signal $X_n$ in the junction 762 to thereby remove the unwanted DC offset from $X_n$ to yield the output signal $Y_n$ on output 766.

It is contemplated that the mean value estimator 758 may reside in or be associated with one or more of the two or more sub-channels to thereby remove the unwanted and differing levels of DC offset from each sub-channel. In this manner, the sub-channels may be combined after parallel processing.

Figure 8A:
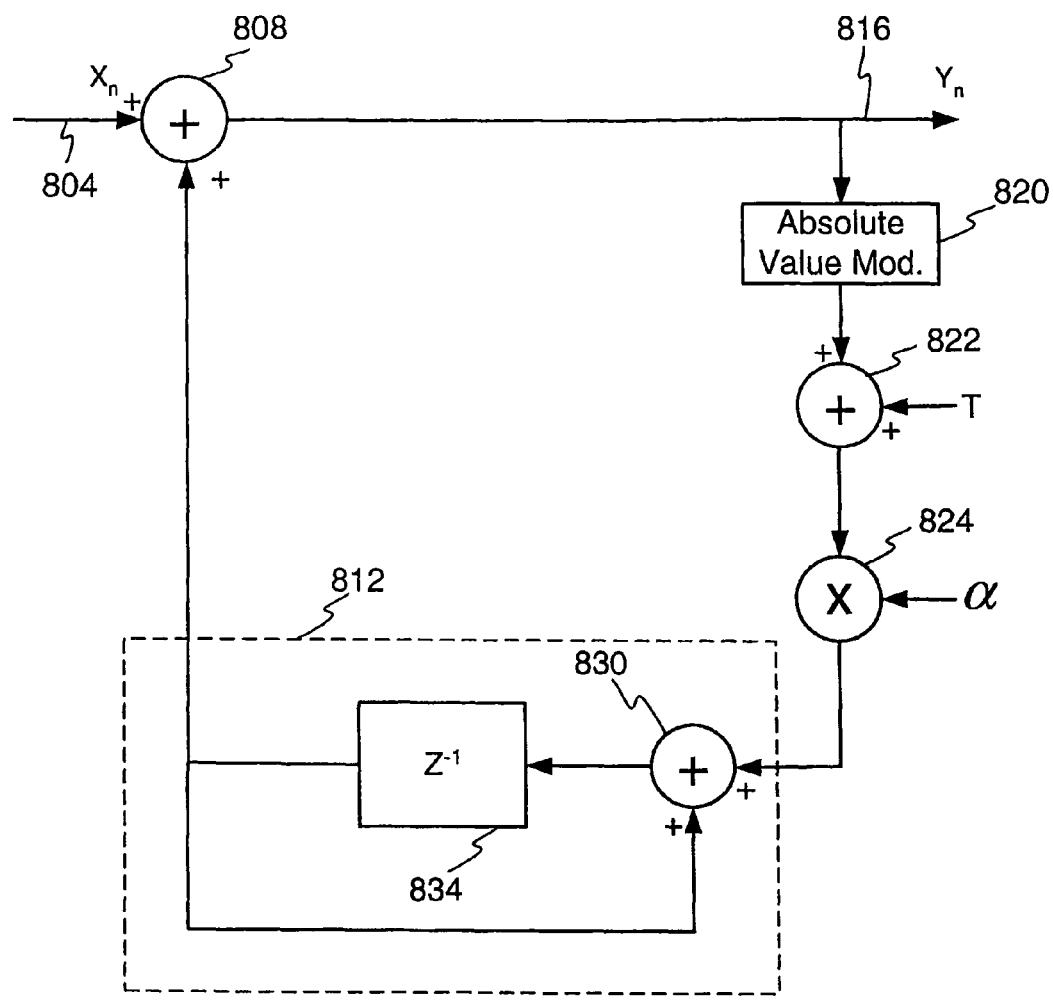
FIG. 8A illustrates a block diagram of an example embodiment of a sub-channel gain mismatch compensation (SCGMC) system.

FIG. 8A illustrates an example embodiment of a sub-channel gain mismatch compensation (SCGMC) system. The SCGMC removes or equalizes gain mismatch between the signals on the sub-channels. This is but one possible configuration and thus, the claims that follow should not be limited to this particular configuration. An input 804 provides a signal $X_n$ to a junction 808. The junction 808 comprises a device configured to combine two or more signals. The junction 808 also receives an input from an accumulator 812, shown within the dashed line enclosure. The output of the summing junction 808 is provided as signal $Y_n$ on output 816 and as an input to an absolute value module 820. The absolute value module 820 calculates or generates the absolute value of a received signal. The output of the absolute value module 820 feeds into a junction 822, which also receives as an input value T. T represents a threshold value selected as a gain convergence point such that the value of T is the value at which the accumulator converges to over numerous cycles or iterations.

The output of the junction 822 arrives at a multiplier 824. The multiplier 824 also receives as an input a value $\alpha$ where $\alpha$ represents a control value to determine the rate of change of the accumulator 812. In one embodiment, the multiplier 824 and value $\alpha$ is used to control the rate of training or rate of change of the accumulator 812. In another embodiment, the control value $\alpha$ is provided directly into the accumulator 816. The multiplier output connects to or is in communication with the accumulator 812.

The accumulator 812 is now described. In this example embodiment, the accumulator 812 comprises a junction 830 and a delay element 834. As discussed above, all the paths within the SCGMC and the accumulator 812 may comprise two or more parallel conductor or connections. The output of the multiplier 824 feeds into the junction 830. The junction 830 also receives as an input a feedback signal from the delay 834. The output of the summing junction 830 feeds into the delay element 834, the output of which is the input to the junction 808. In junction 808, the accumulator output is subtracted or removed from the incoming signal $X_n$.

The operation of the SCGMC is generally similar to the operation of the DCL described above. It is contemplated that any level of gain may be desired, or no gain at all, and, as such, the SCGMC may match, across the different signals on the sub-channels, the level of gain associated with each sub-channel corresponding to the output of the two or more parallel ADCs or a time interleaved ADC system, such as that shown in FIG. 6.

Accordingly, during operation, an incoming signal $X_n$ arrives on input 804 at the junction 808, where the accumulator output value is subtracted. Assuming at start-up the accumulator value is zero, the output of the junction 808 is then equal to $X_n$. The $X_n$ value is provided to the absolute value module 820. The absolute value module 820 generates a representation of the received signal wherein negative portions of the received signal are converted to positive values having generally similar or identical positive magnitudes. The positive values from the absolute value module 820 are combined with the threshold value T in the summing junction 822 and the resulting output is provided to the multiplier 824 and modified by the control value $\alpha$. The threshold value T added to the feedback sets the gain on the sub-channel output 816. In this manner, all of the sub-channels may be established at the same gain level to facilitate combination of the sub-channels into a single channel, for subsequent processing, or both. The gain level may be adjusted relative to the other sub-channels or other reference value.

Thereafter, the multiplier output is provided to the accumulator 812. The feedback to the junction 830 from the delay 834 at this stage is zero, unless preloaded with a value. Over time the accumulator 812 generates a value that approximates the gain offset on the sub-channel. This gain offset is added to the incoming signal $X_n$ in the junction 808. In this manner, the gain offset is established and may be made constant across two or more sub-channels.

Figure 8B:
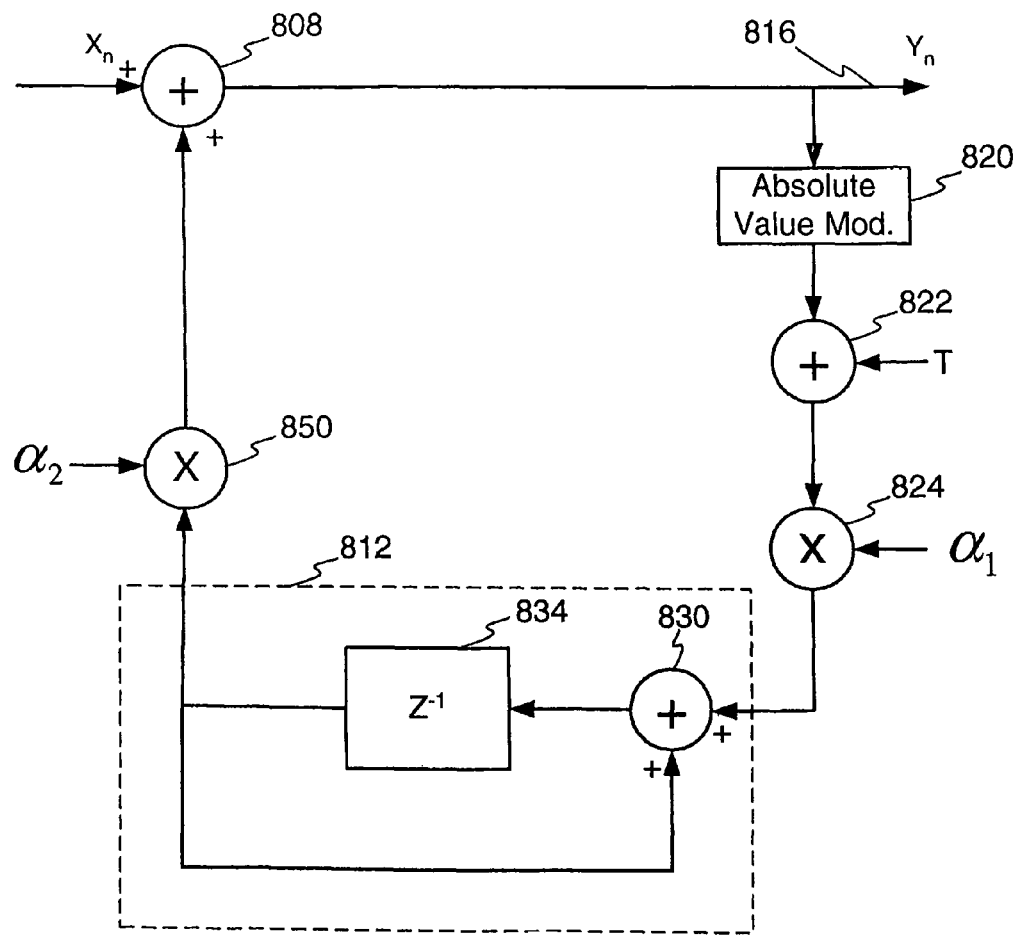
FIG. 8B illustrates a block diagram of an example embodiment of a SCGMC system with first and second multipliers.

FIG. 8B illustrates an example embodiment of a SCGMC system with first and second multipliers 824, 850. The embodiment of FIG. 8A may be ideally suited in a floating point environment whereas the embodiment shown in FIG. 7B may be ideally suited to a fixed point environment. The concept of fixed point and floating point numeric representations are described above and known in the art and hence not described in great detail. As compared to FIG. 8A, identical elements in FIG. 8B are identified with identical reference numerals. In addition, only the aspects of FIG. 8B that differ from FIG. 8A are discussed.

In contrast to FIG. 8A, the embodiment of FIG. 8B includes a second multiplier 850 located between the accumulator 812 and the summing junction 808. In this embodiment, the control value provided to the first multiplier 824 comprises $\alpha_1$ and the control value provided to the second multiplier 850 comprises $\alpha_2$. The second multiplier 850 utilizes the value $\alpha_2$ to scale the output of the accumulator 812. In one embodiment, the control value $\alpha_1$ represents a value greater than one to thereby increase the value of the feedback provided to the accumulator 812. This allows processing to occur utilizing the available numeric range of a fixed point representation used for processing within the accumulator 812. By way of example, this scaling may prevent rounding errors or multiplication operations that yield values of zero.

After processing by the accumulator 812, the second control value $\alpha_2$ reduces the accumulator output to an appropriate level for combination in the junction 808. In one embodiment, the control value $\alpha_2$ comprises a value that is less than one to re-scale the accumulator output. It is contemplated that the second multiplier 850 may also comprise a divider, which may be made to have similar function to a multiplier, or any other apparatus or device configured to achieved the goals set forth herein.

In one embodiment, the values of $\alpha_1$ and $\alpha_2$ as shown in FIG. 8A may be set equal to value of $\alpha_1/\alpha_2$. In other embodiments, the values of $\alpha_1$ and $\alpha_2$ may set to other values as can be calculated by one of ordinary skill in the art.

It is further contemplated that any of the above-described solutions for dealing with signal distortion or inconsistencies between sub-channels after analog to digital conversion, or any other aspect of signal processing, may be enabled in combination or individually. Thus, the de-skew systems, DCL systems, and SCGMC system may be embodied individually in a system or in any combination to suit the particular needs of a communication or other type system.

While various embodiments of the invention have been described, it will be apparent to those of ordinary skill in the art that many more embodiments and implementations are possible that are within the scope of this invention.

What is claimed is:

1. A system for processing an analog signal to convert the analog signal to a digital signal comprising:
    a time-interleaving analog to digital conversion system comprising:
        an input configured to receive an analog signal;
        two or more analog to digital converters, wherein the two or more analog to digital converters are configured to convert at least a portion of the analog signal to two or more digital signals;
        two or more sub-channel outputs configured carry the two or more digital signals;
    a DC offset compensation system, associated with at least one sub-channel output, configured to received a digital signal and remove bias offset from the received digital signal to create at least one compensated digital signal;
    a de-skew system associated with at least one sub-channel output configured to remove skew from the two or more sub-channel outputs or the at least one compensated digital signal from the DC offset compensation system; and
    a multiplexer configured to receive and combine at least one compensated digital signal and at least one digital signal or two or more compensated digital signals to create a digital signal representative of the analog signal.

2. The system of claim 1, wherein the DC offset compensation system comprises a DC loop.

3. The system of claim 1, wherein the DC offset compensation system comprises a DC loop is associated with each sub-channel and configured to perform DC offset removal on each digital signal from the time-interleaving analog to digital conversion system.

4. The system of claim 1, wherein the DC offset compensation system comprises a feedback filter configured to subtract the DC offset from digital signal.

5. The system of claim 1, wherein bias offset comprises a difference in voltage values from the two or more analog to digital converters for a constant input to the two or more analog to digital converters of the time-interleaving analog to digital conversion system.

6. A parallel analog to digital converter system configured to perform analog signal to digital signal conversion of an analog signal comprising:
    an input configured to receive an analog signal;
    two or more parallel analog to digital converters, each of which are configured to process the analog signal to thereby generate and output two or more digital signals on two or more sub-channels, wherein each digital signal represents at least a portion of the analog signal;
    at least one DC loop configured to process at least one of the two or more digital signals to remove unwanted offset from at least one of the two or more digital signals to create two or more offset adjusted digital signals; and
    at least one de-skew system comprising at least one filter associated with each of the two or more sub-channels, the de-skew system configured perform filtering on the two or more offset adjusted digital signals to adjust the phase of the two or more offset adjusted digital signals to reduce phase skew.

7. The system of claim 6 wherein DC loop is associated with each sub-channel.

8. The system of claim 7, further comprising a multiplexer configured to combined the output from each DC loop to create a composite digital signal representing the analog signal, wherein the multiplexer is able to accurately combine the digital signals due to the removal of unwanted bias offset by the two or more DC loops.

9. The system of claim 6, wherein the DC loop comprises:
    an accumulator configured to generate a DC offset value;
    a subtractor configured to remove the DC offset value from at least one of the one or more digital signals.

10. The system of claim 9, further comprising a multiplier configured to receive a control value, the control value selected to control the rate of change of the accumulator.

11. A method for removing inconsistencies in two or more digital signals from an analog to digital converter structure to enable accurate re-assembly of the two or more digital signals, the method comprising:
    receiving two or more digital signal on two or more sub-channels received from the analog to digital converter structure, wherein each digital signal is associated with a sub-channel;
    providing the two or more digital signals to an offset compensation system;
    processing the two or more digital signals to remove unwanted DC offset from each digital signal to thereby establish each digital signal at a generally similar DC offset level; and
    processing each digital signal with a de-skew system to reduce or eliminate phase differences between the two or more digital signals to reduce or eliminate inter-channel skew.

12. The method of claim 11, wherein processing the two or more digital signals comprises:
    multiplying a digital signal by a control value to obtain a scaled digital signal;
    processing the scaled digital signal to generate an offset value representative of the DC offset generated by the analog to digital converter associated with the sub-channel; and
    subtracting the offset value from the digital signal to create a digital signal without DC offset.

13. The method of claim 12, further comprising scaling the value of the digital signal prior to DC offset compensation to accommodate a fixed point processing environment.

14. The method of claim 11, wherein the offset compensation system comprises a DC offset compensation module associated with each channel.

15. The method of claim 11, wherein the inconsistencies comprise DC offsets resulting from differences between analog to digital converters within the analog to digital converter structure.

16. The method of claim 11, further comprising recombining the two or more digital signals on the two or more sub-channels into a single digital signal.

17. A method for converting a high frequency analog signal to a digital signal comprising:
    providing the analog signal to one or more analog to digital converters;
    converting the analog signal to two or more digital signals;
    receiving the two or more digital signals from the one or more analog to digital converters, wherein the two or more digital signals are associated with two or more sub-channels, wherein the two or more sub-channels comprise at least a first sub-channel and a second sub-channel;

processing at least one of the digital signals to establish the offset of the two or more digital signals at a generally similar offset level to create two or more offset adjusted digital signals; and filtering the two or more offset adjusted digital signals to create two or more filtered signals for the first sub-channel and two or more filtered signals for the second sub-channel;

combining at least one filtered signal from the first sub-channel with at least one filtered signal from the second sub-channel to reduce phase differences between the two or more offset adjusted digital signals to create two or more outputs;

combining the two or more outputs into a combined digital signal, wherein the combining may accurately occur due to the generally similar offset level of the two or more digital signal.

18. The method of claim 17, wherein the offset level is generally zero DC offset.

19. The method of claim 17, wherein a multiplexer performs the combining.

20. The method of claim 17, wherein a sub-channel gain mismatch compensation processes the signal to remove gain mismatch between sub-channels in addition to processing to remove offset.

21. The method of claim 17, wherein two or more sub-channels comprises four sub-channels.

22. The method of claim 17, wherein two or more sub-channels comprises eight sub-channels.

23. The method of claim 17, wherein the method occurs within a 10 gigabit communication system operating over CAT 5 cable.

24. The method of claim 17, wherein the processing at least one of the digital signal comprises subtracting a DC offset value from the digital signal, the DC offset value created by inconsistencies between the two or more analog to digital converters.

25. An analog to digital converter system configured to perform analog signal to digital signal conversion of an analog signal comprising:

an input configured to receive an analog signal;

two or more parallel analog to digital converters, each of which are configured to process the analog signal to thereby generate one or more digital signals representing at least a portion of analog signal;

two or more sub-channel gain mismatch compensation modules configured to process the digital signal to remove unwanted gain offset from the one or more digital signals to create a processed digital signal for each sub-channel;

a de-skew system comprising at least one filter associated with each sub-channel, the at least one filter configured to reduce phase differences between signals on sub-channels to create a phase aligned processed digital signal for each sub-channel; and a switch or multiplexer configured to receive and combine the phase aligned processed digital signal for each sub-channel to create a single digital signals representing of the analog signal.

26. The system of claim 25, wherein each analog to digital converter is associated with a sub-channel.

27. The system of claim 25, wherein the analog to digital converters are part of a time interleaved analog to digital conversion system.

28. The system of claim 25, wherein the sub-channel gain mismatch compensation modules comprises:

an accumulator configured to generate the gain offset value;

a subtractor configured to remove the gain offset value from at least one of the one or more digital signals.

29. The system of claim 28, further comprising a multiplier configured to receive a control value, the control value selected to control the rate of change of the accumulator.

* * * * *